(12) United States Patent  (10) Patent No.: US 8,710,637 B2
Tashiro et al.  (45) Date of Patent: Apr. 29, 2014

(54) SEMICONDUCTOR DEVICE AND METHOD OF MANUFACTURING THE SAME

(71) Applicant: Renesas Electronics Corporation, Kawasaki (JP)

(72) Inventors: Yukinori Tashiro, Kanagawa (JP); Yoshinori Miyaki, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/939,766

(22) Filed: Jul. 11, 2013

(65) Prior Publication Data
US 2013/0292815 A1 Nov. 7, 2013

Related U.S. Application Data

(62) Division of application No. 13/165,997, filed on Jun. 22, 2011, now Pat. No. 8,525,306.

(30) Foreign Application Priority Data

Jul. 21, 2010 (JP) .................................. 2010-163671

(51) Int. Cl.
H01L 23/495 (2006.01)
(52) U.S. Cl.
USPC .................... 257/676; 257/666; 257/E23.033
(58) Field of Classification Search
USPC ......... 257/666, 676, 686, 692, 784, 787, 778, 257/E23.033, E21.506
See application file for complete search history.

(56) References Cited

U.S. PATENT DOCUMENTS

| 6,476,506 | B1* | 11/2002 | O'Connor et al. ............ 257/786 |
| 6,534,879 | B2* | 3/2003 | Terui ............................. 257/786 |
| 7,323,788 | B2 | 1/2008 | Miyaki et al. |
| 2005/0121805 | A1 | 6/2005 | Matsuzawa et al. |

FOREIGN PATENT DOCUMENTS

| JP | 5-243307 A | 9/1993 |
| JP | 8-236564 A | 9/1996 |
| JP | 2003-338519 A | 11/2003 |
| JP | 2005-191447 A | 7/2005 |

* cited by examiner

Primary Examiner — Chuong A Luu
Assistant Examiner — Nga Doan
(74) Attorney, Agent, or Firm — Mattingly & Malur, PC

(57) ABSTRACT

To suppress a short circuit between neighboring wires which is caused when the loop of a wire is formed into multiple stages in a semiconductor device in which a wiring board and one semiconductor chip mounted over a main surface thereof are electrically coupled with the wire. In a semiconductor device in which a chip is mounted on an upper surface of a wiring board and a bonding lead of the wiring board and a bonding pad of the chip are electrically coupled with wires, a short circuit between the neighboring wires is suppressed by making larger the diameter of the longest wire arranged in a position closest to a corner part of the chip than the diameter of the other wires.

5 Claims, 41 Drawing Sheets

SEMICONDUCTOR DEVICE AND METHOD OF MANUFACTURING THE SAME

CROSS-REFERENCE TO RELATED APPLICATION

This application is a divisional of U.S. patent application Ser. No. 13/165,997, filed Jun. 22, 2011, which claims priority to Japanese Patent Application No. 2010-163671, filed Jul. 21, 2010, the disclosure of which, including the specification, drawings and abstract is incorporated herein by reference in its entirety.

BACKGROUND

The present invention relates to a semiconductor device and manufacturing technology thereof and, more particularly, to technology effective when applied to a semiconductor device in which a wiring board and a semiconductor chip mounted over the main surface thereof are electrically coupled with a wire.

Patent Document 1 (Japanese Patent Laid-Open No. 2005-191447) discloses a semiconductor device in which a wiring board and a semiconductor chip (hereinafter, referred to only as a chip) mounted over the main surface of the wiring board are electrically coupled with a wire (bonding wire). On the main surface of the chip mounted over the wiring board, a plurality of pads including pads in a power source system (bonding pads) and pads in a signal input/output system is arranged in two columns and in a staggered manner. The width of the power source system pad is greater than that of the signal input/output system pad and the diameter of a wire coupled to the power source system pad is larger than that of a wire coupled to the signal input/output system pad. Further, by making the loop height of the wire coupled to the pad of the pads arranged in the two columns, which is in the inner column of the chip, different from that of the wire coupled to the pad of the pads arranged in the two columns, which is in the outer column, and bonding the wire with the higher loop height after bonding the wire with the lower loop height, neighboring wires are prevented from coming into contact.

Patent Document 2 (Japanese Patent Laid-Open No. 2003-338519) discloses a semiconductor device in which pads on the main surface of a chip are arranged in two columns and in a staggered manner as in Patent Document 1. In the semiconductor device, in the first and second wires of a plurality of wires electrically coupling the pad of the chip and the coupling part of a wiring board, which are adjacent to each other, the loop height of the second wire is made greater than that of the first wire and one end part of the second wire is coupled to the pad at a position farther away from one side of the chip than one end part of the first wire. Further, the other end part of the second wire is coupled to the coupling part of the wiring board at a position farther away from one side of the chip than the other end part of the first wire.

Patent Document 3 (Japanese Patent Laid-Open No. 1993-243307) discloses technology to prevent the deformation of a wire (wire flowing) when sealing a chip and the wire with a resin by constituting a wire (wire longer than other wires) of a plurality of wires electrically coupling the pad of the chip and the lead of a lead frame, which is located in the vicinity of a corner part of the chip, by a rigid wire or a thick wire.

Patent Document 4 (Japanese Patent Laid-Open No. 1996-236564) discloses technology to prevent the wire flowing by changing the diameters of a plurality of wires coupling the pad of a chip and the lead of a lead frame according to the position of the pad arranged on the main surface of the chip. Specifically, the technology to make larger the diameter of the wire to be coupled to the pad in the vicinity of the corner part of the chip than the diameter of the other wires, or the technology to make larger the diameter of the wire coupled in the direction along an interface in which a resin injected into a molding die flows than the diameter of the wire coupled in the direction crossing the interface, etc., is employed.

SUMMARY

As functions of a semiconductor device become more sophisticated and the number of functions thereof increases, the number of bonding pads (electrode pads) of a chip constituting an external coupling terminal of an integrated circuit is increasing steadily. On the other hand, there is a demand to downsize a semiconductor device.

Hence, in a semiconductor device in which the bonding pad (electrode pad) and the bonding lead (electrode pad) of the wiring board are electrically coupled via a wire, the pitch of each electrode pad tends to be narrowed and due to this, the distance between wires of a plurality of wires, which are adjacent to each other, becomes short and a short circuit failure becomes more likely to occur, in which wires come into contact with each other, in a resin sealing step.

As countermeasures to prevent a short circuit between neighboring wires, a method is thought to be effective, in which the bonding pads of the chip are arranged across a plurality of columns (for example, two columns) and in a staggered manner or the distance between neighboring wires is increased by alternately changing the loop heights of the neighboring wires as in, for example, Patent Document 1 and Patent Document 2 described above. Further, a method is also thought to be effective, in which the distance between neighboring wires is increased by shifting the positions to which the wires are coupled from each other along the direction in which the wires extend in the neighboring bonding pads as in Patent Document 2.

However, according to the examination of the inventors of the present invention, it has been found out that a short circuit failure of the wires occurs even if the coupling points (bonding pads) of the wires in the chip are arranged in a staggered manner or the distance between neighboring wires is increased by alternately changing the loop heights of the wires. This is because it becomes difficult to sufficiently secure the distance between neighboring wires as the number of electrode pads increases and the pitch of the electrode pad becomes narrower. Here, a short circuit of wires includes a leak between wires which occurs in a state where the wires are very close to each other although the wires are not in complete contact, in addition to a case where wires are in complete contact. This leak is a phenomenon that occurs generally when the distance between wires becomes equal to or smaller than the diameter of the wire.

According to the examination of the causes of the above-mentioned failure by the inventors of the present invention, it has been made clear that a failure is likely to occur in a wire coupled to a bonding pad of the bonding pads, which is arranged at a corner part or in the vicinity of a chip, a shape in plan view of which is comprised of a quadrangle, and formed so as to be located in the uppermost stage (that is, the loop height is the greatest).

This phenomenon is explained using FIG. 37 to FIG. 42. FIG. 37 is a plan view showing an example of a semiconductor device in which a chip 51 is mounted on the upper surface of a wiring board 50 and a bonding lead 52 of the wiring board 50 and a bonding pad 53 of the chip 51 are electrically coupled with a wire 54. In the semiconductor device, the boding pads 53 of the chip 51 are arranged in two columns and in a staggered manner and at the same time, the boding leads 52 of the wiring board 50 are arranged in two columns and in a staggered manner. Further, in the semiconductor device, as shown in FIG. 38 (section view along G-G line in FIG. 37), the bonding pad 53 in the outer column of the chip 51 and the bonding lead 52 in the column closer to the chip 51 are coupled with the low loop wire 54 and the bonding pad 53 in the inner column of the chip 51 and the bonding lead 52 in the column distant from the chip 51 are coupled with the high loop wire 54.

FIG. 39 is a section view when the wiring board 50 is attached to a molding die 55 and a sealing resin 58 in a molten state is injected into a cavity 57 through a gate 56 in order to seal the chip 51 and the wire 54 over the wiring board 50 with a resin. FIG. 40 is a plan view of essential parts in which the direction of the flow of the sealing resin 58 in the vicinity of the corner part of the chip 51 is shown by arrows.

When the sealing resin 58 injected into the cavity 57 of the molding die 55 reaches the vicinity of the corner part of the chip 51, a high loop wire 54h of the wires 54 coupled to the bonding pad 53 arranged in the vicinity of the corner part of the chip 51, which couples the bonding pad 53 in the inner column of the chip 51 and the bonding lead 52 in the column distant from the chip 51, deforms in the direction of the arrows in the plane horizontal with the upper surface of the wiring board 50 as shown in FIG. 40.

This is because the wire length of the wire 54 of the wires 54 coupling the chip 51 and the wiring board 50, which is coupled to the bonding pad 53 in the vicinity of the corner part of the chip 51, is greater than the wire length of the wire 54 to be coupled to the bonding pad 53 in another region of the chip. Further, the wire length of the high loop wire 54 (the wire 54 coupling the bonding pad 53 in the inner column of the chip 51 and the bonding lead 52 in the column distant from the chip 51) is greater than the wire length of the low loop wire 54 (the wire 54 coupling the bonding pad 53 in the outer column of the chip 51 and the bonding lead 52 in the column close to the chip 51), and therefore, the high loop wire 54h arranged in the vicinity of the corner part of the chip 51 is the greatest in the wire length and most likely to deform.

Further, the sealing resin 58 in the molten state injected into the cavity 57 exerts a pressure on the wire not only in the transverse direction (direction horizontal with the upper surface of the wiring board 50) but also in the longitudinal direction (direction perpendicular to the upper surface of the wiring board 50). Accordingly, the high loop wire 54h arranged in the vicinity of the corner part of the chip 51 deforms not only in the transverse direction (direction of the arrows in FIG. 40) but also in the downward direction. As a result of that, as shown in FIG. 41 (section view along H-H line in FIG. 40), a short circuit failure occurs between the high loop wire 54h arranged in the vicinity of the corner part of the chip 51 and the low loop wire 54 neighboring the wire 54h, that is, the wire located obliquely under the wire 54h.

Here, a case is explained where the loop of the wire 54 is formed into two stages (high loop and low loop), however, as shown in FIG. 42, for example, also when the loop of the wire 54 is formed into three stages (high loop, middle loop, low loop), a short circuit occurs between the high loop wire 54h arranged in the vicinity of the corner part of the chip 51 and a middle loop wire 54m neighboring the wire 54h. That is, in general, when the loop of the wire is formed into multiple stages, a short circuit occurs between the longest wire of the wires arranged in the vicinity of the corner part of the chip, which is located in the uppermost stage, and the wire neighboring the wire in the stage one stage lower.

As described above, with the conventional technology to increase the distance between neighboring wires by arranging the bonding pads of the chip in a staggered manner or by alternately changing the loop heights of the wires, it is not possible to effectively prevent a short circuit between wires arranged in the vicinity of the corner part of the chip when the loop of the wire is formed into multiple stages.

Patent Documents 3, 4 describe technology to make the diameter of the wire in which the wire flowing is likely to occur larger than the diameter of other wires as a countermeasure to prevent a short circuit failure (wire flowing) resulting from the deformation of the wire at the time of resin sealing. However, Patent Documents 3, 4 do not target a semiconductor device in which the wire loop is formed into multiple stages. In other words, in the case where the wire is formed into a plurality of stages, a position where wire flowing is likely to occur in particular cannot be identified.

The present invention has been made in view of the above circumstances and provides technology to suppress a short circuit between neighboring wires that occurs when the wire loop is formed into multiple stages in a semiconductor device in which a wiring board and one chip mounted over the main surface thereof are electrically coupled with a wire.

The present invention has also been made in view of the above circumstances and provides technology to reduce the amount of use of wire electrically coupling a chip and a wiring board.

The other purposes and the new feature of the present invention will become clear from the description of the present specification and the accompanying drawings.

The following explains briefly the outline of a typical invention among the inventions disclosed in the present application.

A semiconductor device, which is a preferable embodiment of the present invention, is a semiconductor device in which a plurality of boding leads formed on a wiring board and a plurality of bonding pads formed on a chip are electrically coupled, respectively, with wires. The bonding leads have a plurality of first column bonding leads arranged along a first substrate side of the upper surface of the wiring board in plan view and a plurality of second column bonding leads arranged along the first substrate side of the upper surface of the wiring board and also arranged between the first column bonding leads and the first substrate side in plan view. The bonding pads have a plurality of first column bonding pads arranged along a first chip side of the front surface of the chip in plan view and a plurality of second column bonding pads arranged along the first chip side of the front surface of the chip and also arranged on the side closer to the central part of the front surface than the first column bonding pads in plan view. The diameter of a corner part wire of the second wires electrically coupling the second column bonding pads and the second column bonding leads, respectively, which is coupled to the bonding pad arranged at the corner part on the front surface of the chip, is larger than the diameter of the wires of the first wires and the second wires, which are other than the corner part wire.

The following explains briefly the effect acquired by the typical invention among the inventions disclosed in the present application.

According to the preferable embodiment of the present invention described above, it is possible to suppress a short circuit between neighboring wires that occurs when the wire loop is formed into multiple stages in a semiconductor device in which a wiring board and one chip mounted over the main surface thereof are electrically coupled with a wire.

DETAILED DESCRIPTION

Figure 1:
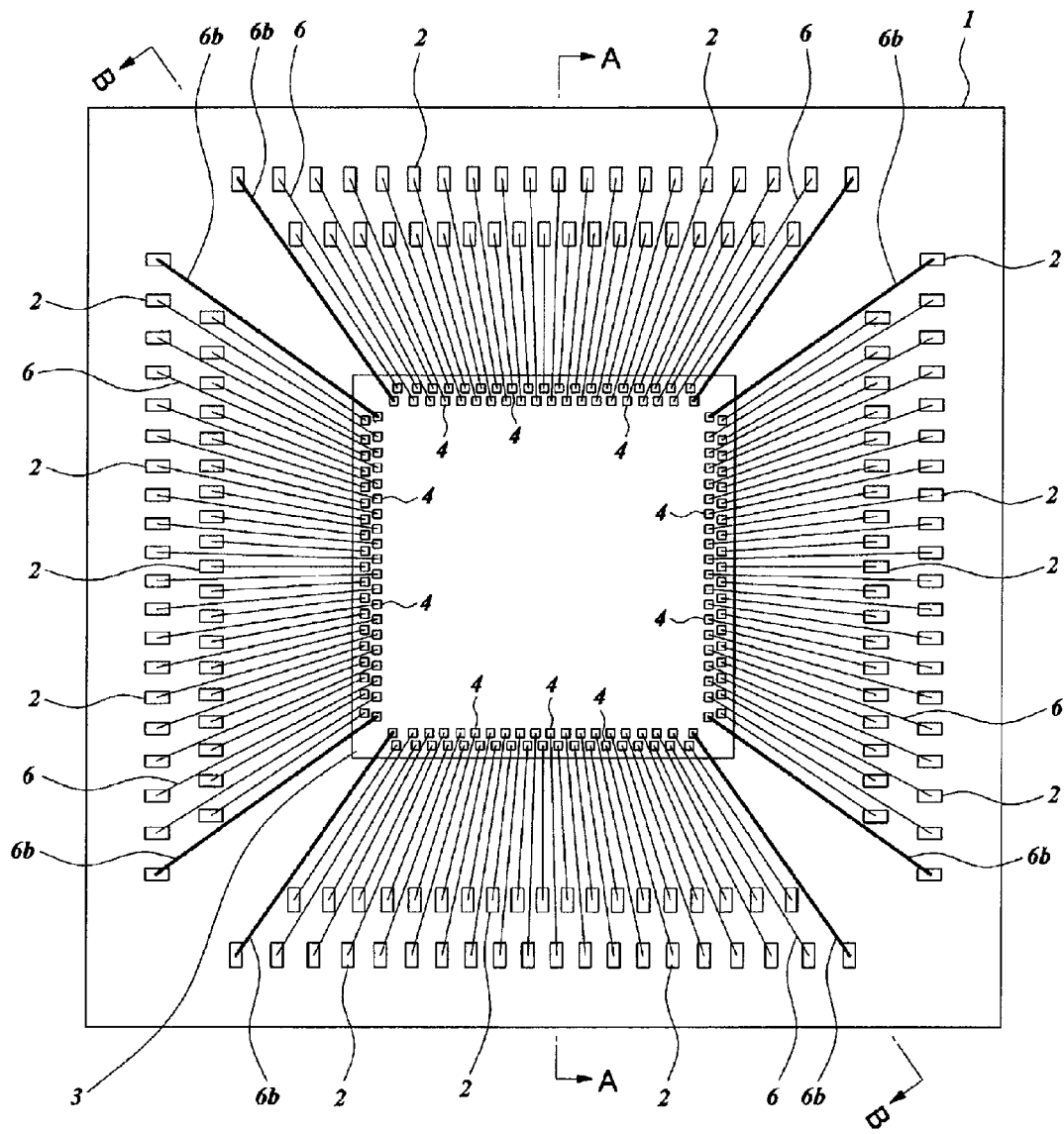
FIG. 1 is a plan view showing an internal structure of a semiconductor device, which is a first embodiment of the present invention.

Hereinafter, embodiments of the present invention are explained in detail based on the drawings. In all the drawings for explaining embodiments, the same symbol is attached to the member having the same function and the repeated explanation thereof is omitted. In the embodiments, the explanation of the same or similar part is not repeated, as a principle, except when necessary in particular. Further, in a drawing for explaining embodiments, in order to make the drawing intelligible, hatching may be attached even if it is a plan view or hatching may be omitted even if it is a section view.

(First Embodiment)

<Semiconductor Device>

Figure 2:
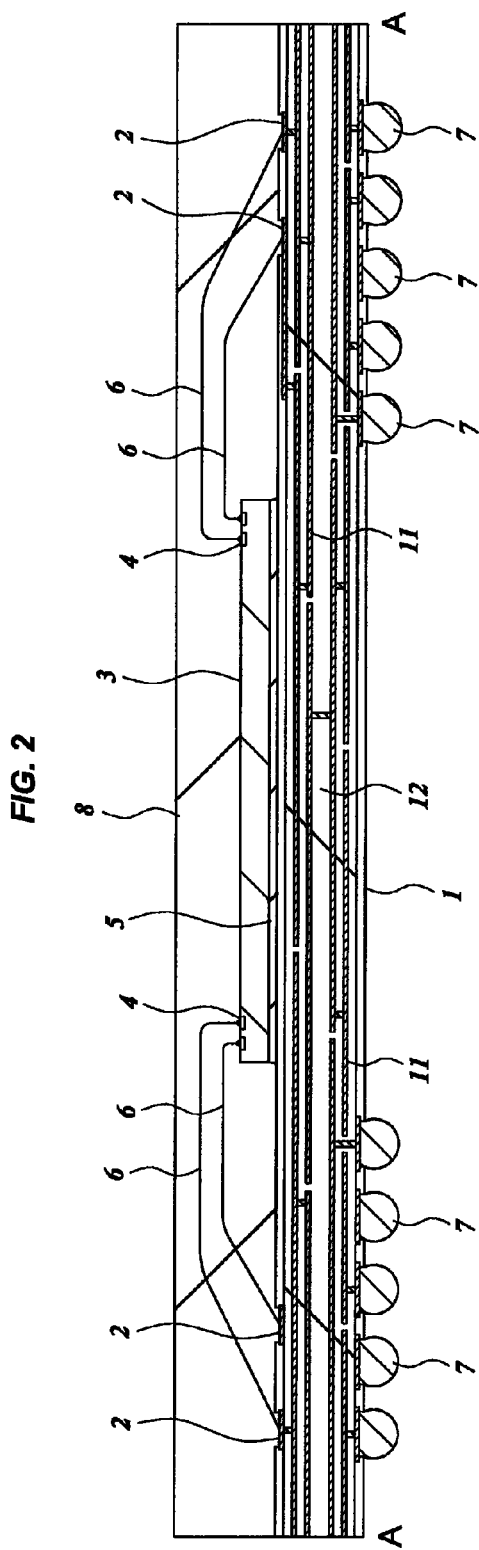
FIG. 2 is a section view along A-A line in FIG. 1.
Figure 3:
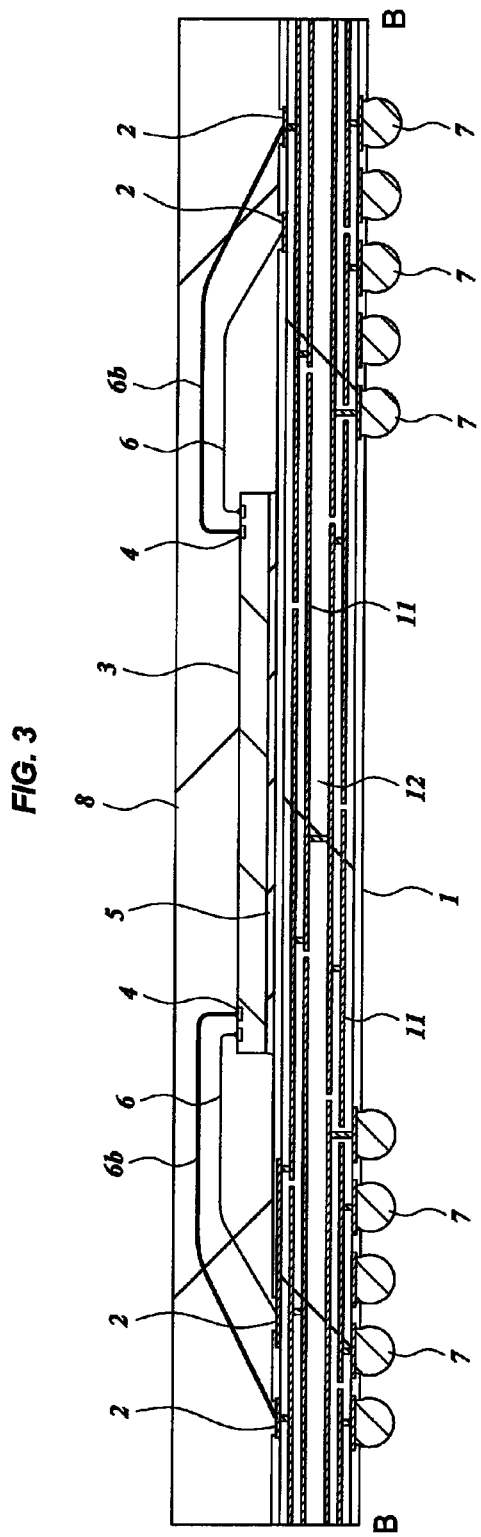
FIG. 3 is a section view along B-B line in FIG. 1.
Figure 4:
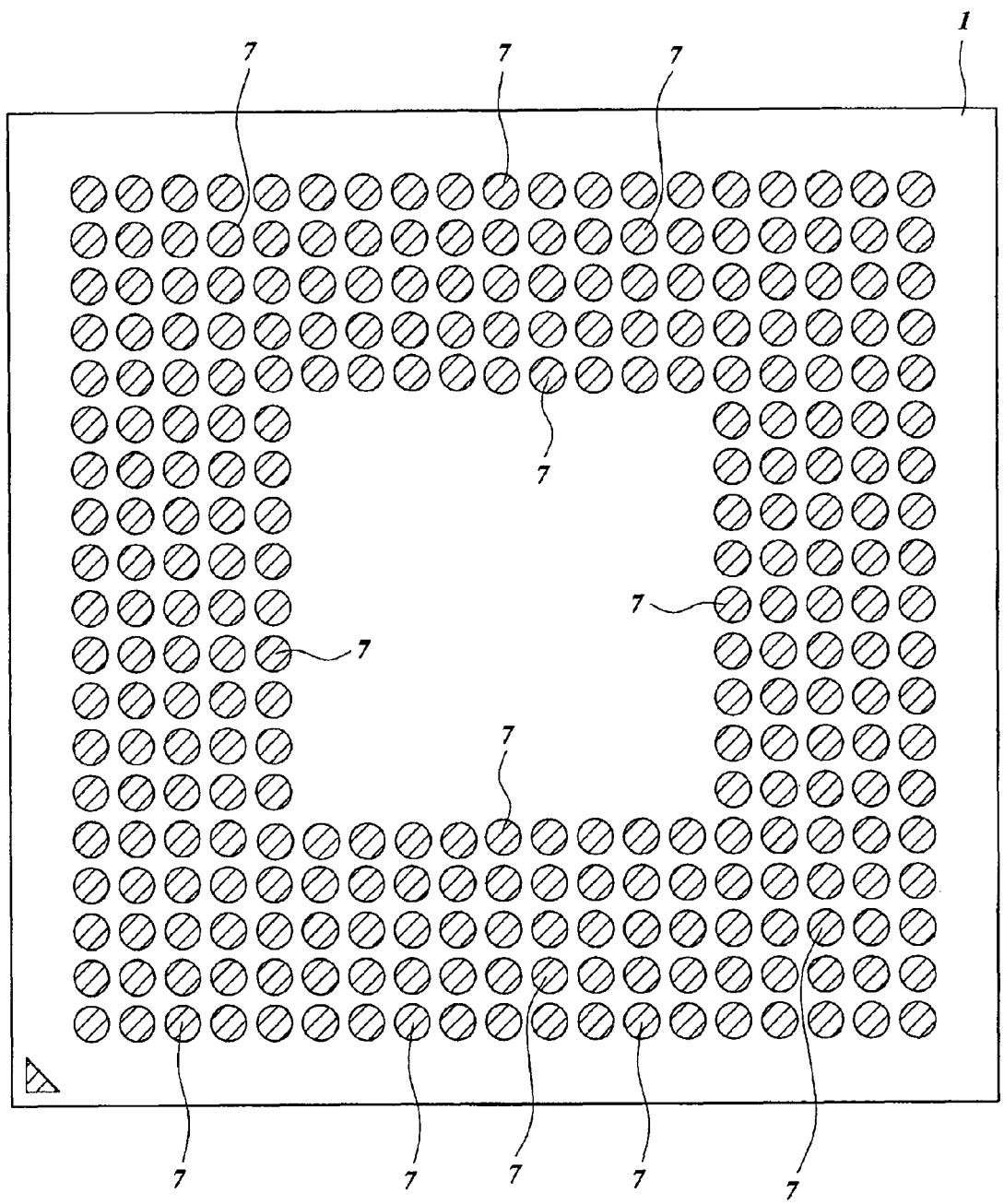
FIG. 4 is a plan view showing a rear surface of the semiconductor device shown in FIG. 1.

FIG. 1 is a plan view showing an internal structure of a semiconductor device in a first embodiment, FIG. 2 is a section view along A-A line in FIG. 1, FIG. 3 is a section view along B-B line in FIG. 1, and FIG. 4 is a plan view showing the rear surface of the semiconductor device shown in FIG. 1. In FIG. 1, a sealing resin is not shown schematically.

The semiconductor device in the first embodiment is a BGA (Ball Grid Array) of individual chip mold type in which one chip 3 is mounted on the upper surface (front surface, chip mount surface) of a wiring board 1 and to the lower surface (rear surface, motherboard mounting surface) of the wiring board 1, a plurality of solder balls 7 is coupled.

The chip 3 is mounted at the central part (chip mount region) of the wiring board 1 in a state where its rear surface (second main surface) is in opposition to the upper surface of the wiring board 1. That is, the chip 3 is mounted on the upper surface of the wiring board 1 by so-called face-up mounting. On the periphery of the front surface (first main surface) of the chip 3, a plurality of bonding pads (electrode pads) 4 is formed. Further, the rear surface of the chip 3 is fixed on the upper surface of the wiring board 1 via an adhesive (adhesive layer) 5 made of an epoxy based thermosetting resin etc.

On the periphery of the upper surface of the wiring board 1, a plurality of boding leads (electrode pads) 2 is formed so as to surround the chip 3. Then, these bonding leads 2 and the bonding pads 4 on the front surface of the chip 3 are electrically coupled via wires (bonding wires) 6, 6b made of gold (Au). Further, the bonding lead 2, the chip 3, and the wires 6, 6b are sealed with a sealing resin (sealing body) 8 covering the entire upper surface of the wiring board 1. The sealing resin 8 is made of an epoxy based thermosetting rein containing a silica filler.

<Wiring Board>

Figure 5:
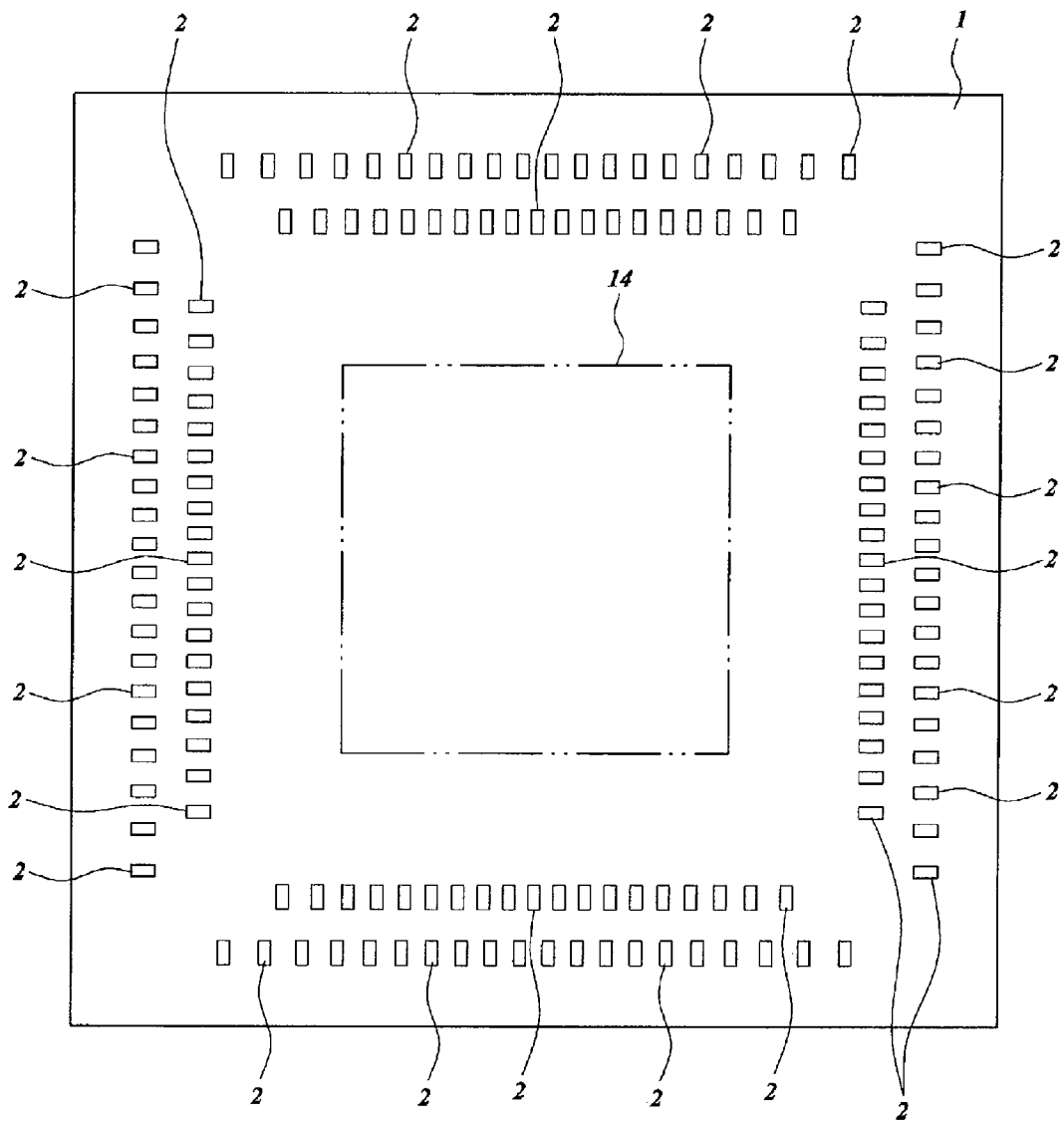
FIG. 5 is a plan view showing an upper surface of a wiring board of the semiconductor device, which is the first embodiment of the present invention.
Figure 6:
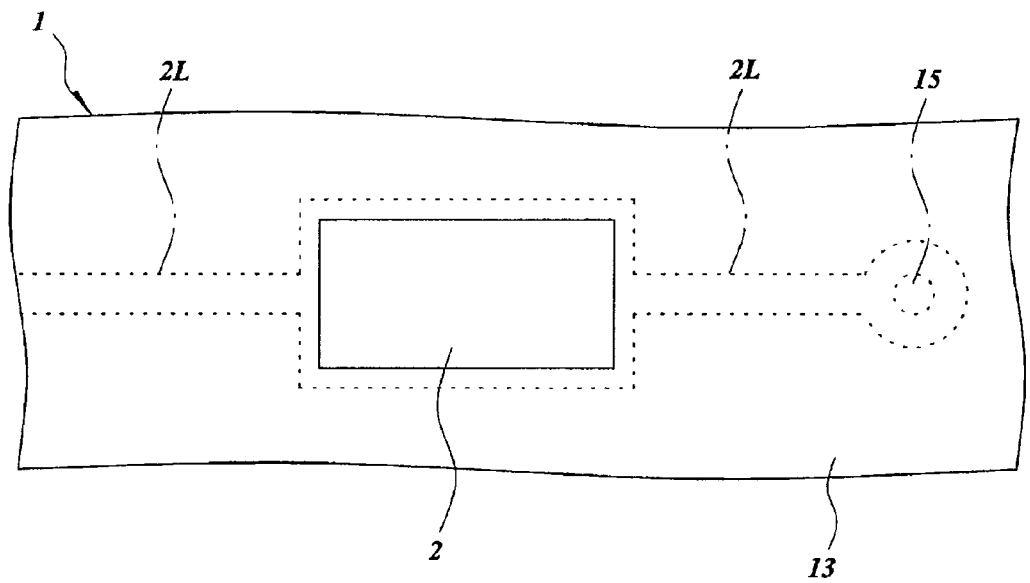
FIG. 6 is an enlarged plan view showing a part of the wiring board shown in FIG. 5.
Figure 7:
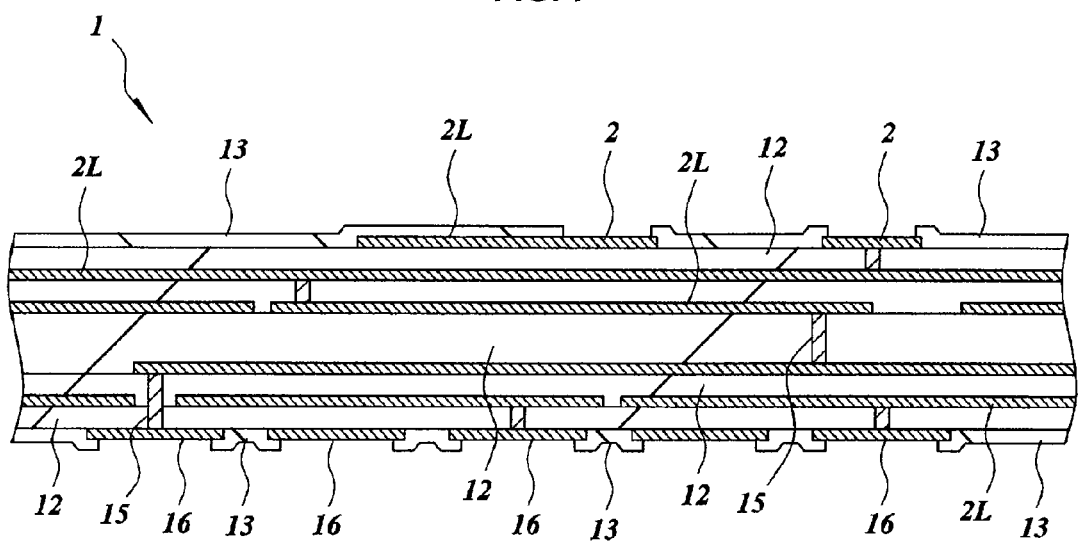
FIG. 7 is an enlarged section view showing a part of the wiring board of the semiconductor device, which is the first embodiment of the present invention.
Figure 8:
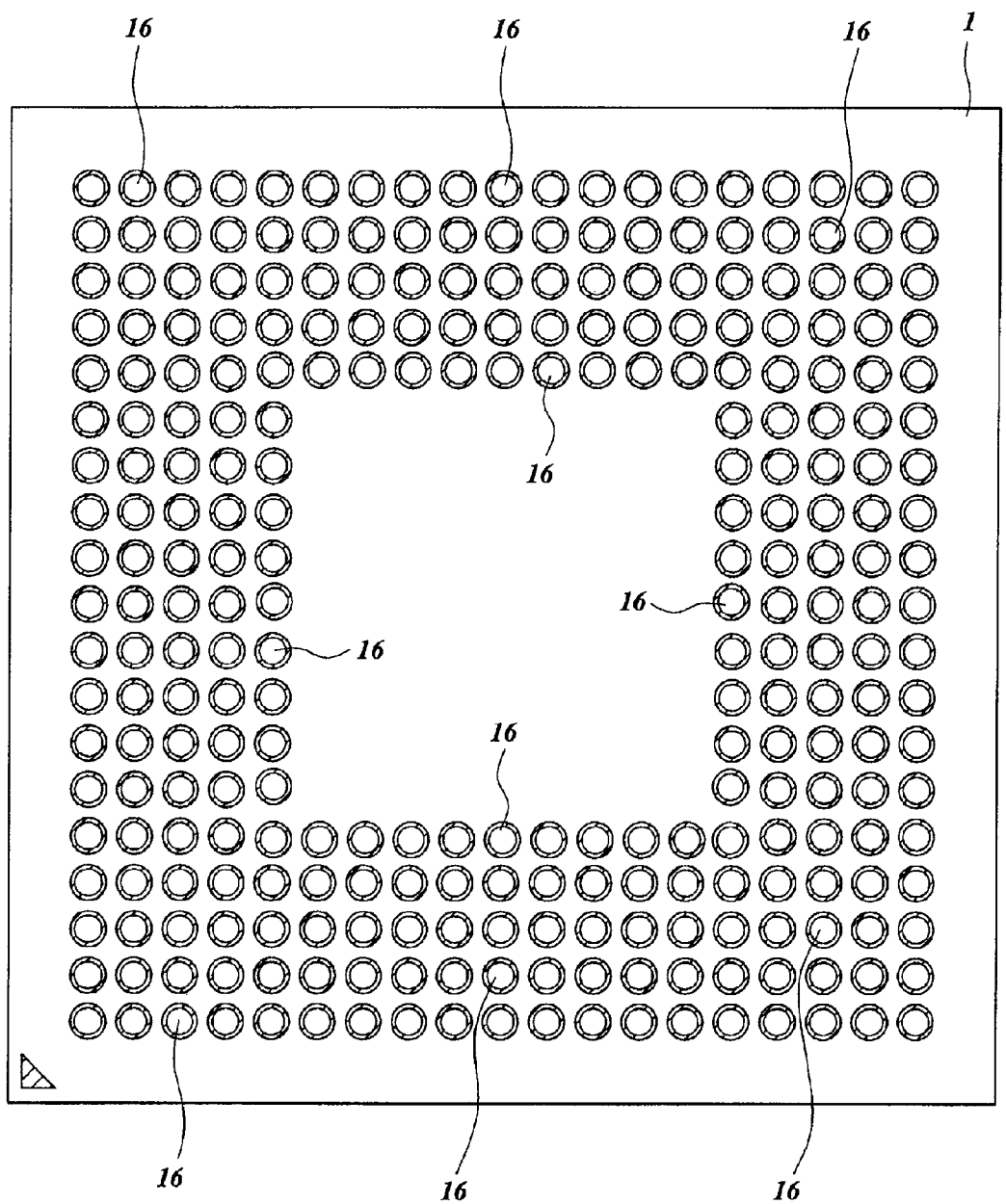
FIG. 8 is a plan view showing a lower surface of the wiring board of the semiconductor device, which is the first embodiment of the present invention.

FIG. 5 is a plan view showing the upper surface of the wiring board 1, FIG. 6 is an enlarged plan view showing a part (one bonding lead 2 and the region in the vicinity thereof) in FIG. 5, FIG. 7 is an enlarged section view showing a part of the wiring board 1, and FIG. 8 is a plan view showing the lower surface of the wiring board 1.

The wiring board (interposer substrate) 1 is a multilayer wiring board in which wires 2L in a plurality of layers (for example, five layers) and insulating layers 12 are laminated alternately. The wire 2L is made of, for example, a copper (Cu) film, and the insulating layer 12 is made of a glass fiber or carbon fiber impregnated with, for example, an epoxy resin. Further, on the upper surface and the lower surface of the wiring board 1, a solder resist 13, which is an insulating film to protect the wire 2L, is formed.

As shown in FIG. 5, at the central part of the upper surface of the wiring board 1, a shape in plan view of which is comprised of a quadrangle (quadrangular shape), a chip mount region 14, a shape in plan view of which is comprised of a quadrangle, is provided. The chip mount region 14 is a region in which one chip 3 is mounted by face-up mounting (see FIG. 1 to FIG. 3). On the periphery of the upper surface of the wiring board 1 (in the region outside the chip mount region 14), the bonding leads 2 are formed. These bonding leads 2 are arranged in two columns and in a staggered manner along each side of the chip mount region 14.

As shown in FIG. 6 and FIG. 7, the bonding lead 2 is configured integrally with the wire 2L of the wires 2L in the layers formed on the wiring board 1, which is in the uppermost layer. That is, the part of the wire 2L, which is in the uppermost layer and not coated with the solder resist 13, constitutes the bonding lead 2. Further, the bonding lead 2 has a configuration in which nickel (Ni) and gold plating layers (not shown schematically) are formed on the front surface of the copper film constituting the wire 2L in the uppermost layer. As shown in FIG. 7, the bonding lead 2 is electrically coupled to a land 16 on the lower surface of the wiring board 1 via the wire 2L in the layers formed inside the wiring board 1 and a via hole 15 coupling them.

As shown in FIG. 8, on the lower surface of the wiring board 1, a plurality of the lands 16, which are electrode pads to couple the solder ball 7 shown in FIG. 2, FIG. 3, is arranged in an array (in a matrix). The land 16 is made of the same material (copper film) as that of the wire 2L and on the front surface thereof, nickel and gold plating layers (not shown schematically) are formed.

The solder ball 7 to be coupled to the land 16 of the wiring board 1 constitutes an external coupling terminal to electrically couple the semiconductor device (BGA) to the mounting board (motherboard). That is, the semiconductor device (BGA) is mounted on the mounting board (motherboard) via the solder ball 7, and therefore, the wiring board 1 functions as an interposer substrate to couple the chip 3 to the mounting board (motherboard).

The solder ball 7 is made of, for example, so-called lead-free solder, not containing lead (Pb) substantially. As the lead-free solder, mention is made of tin (Sn), tin-bismuth (Bi) alloy, tin-copper-silver (Ag) alloy, etc.

<Semiconductor Chip>

Figure 9:
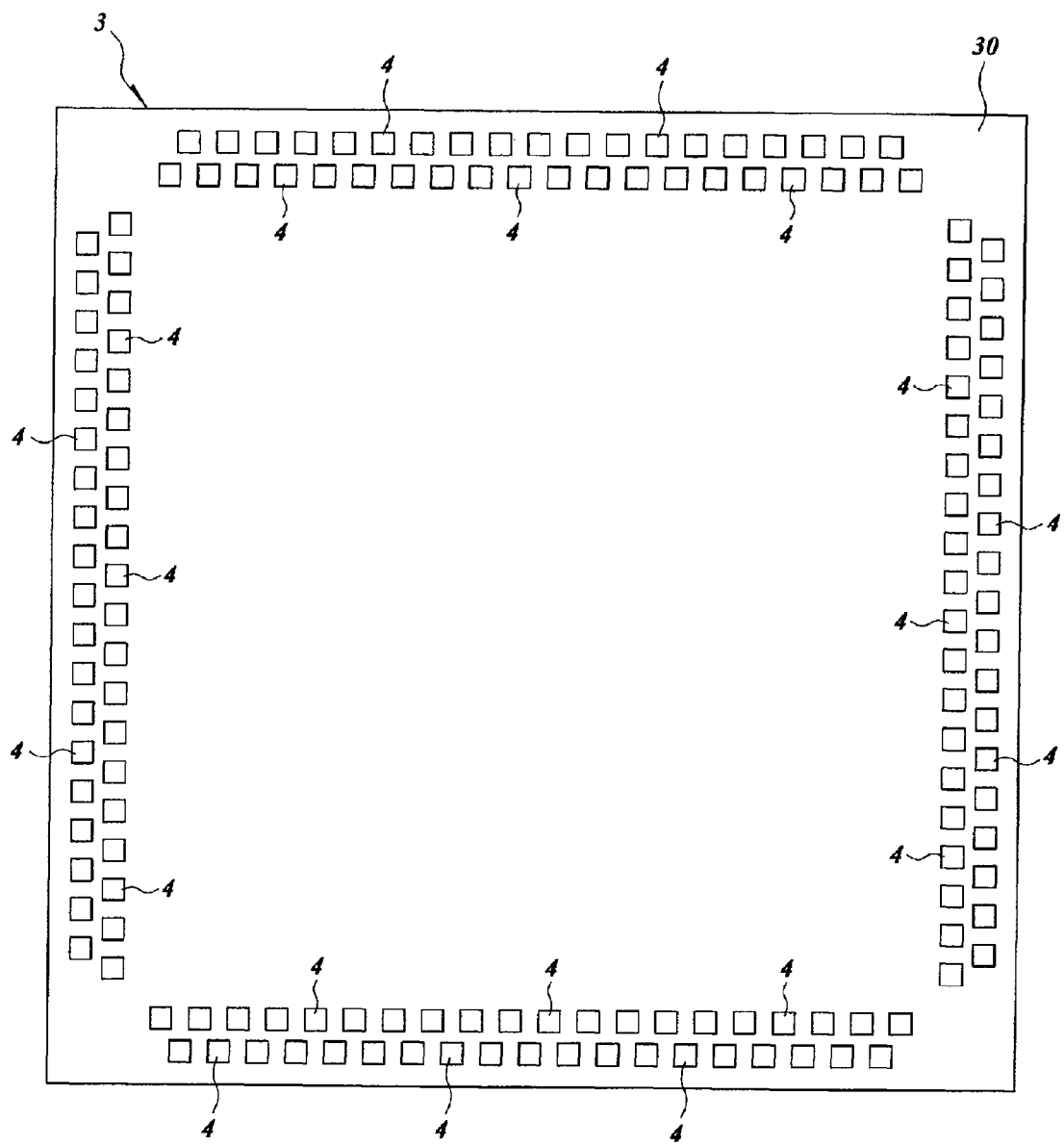
FIG. 9 is a plan view showing a front surface of a chip mounted on the wiring board of the semiconductor device, which is the first embodiment of the present invention.
Figure 10:
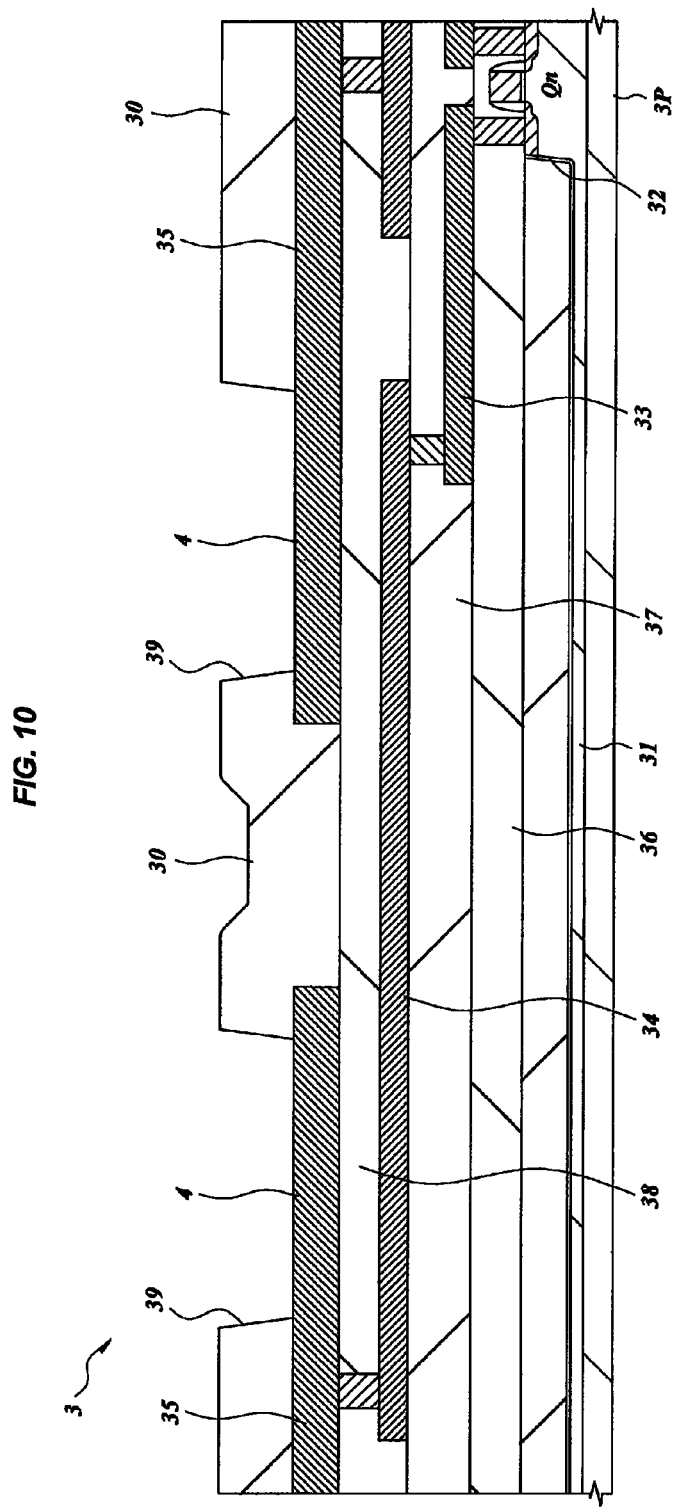
FIG. 10 is an enlarged section view of a part of the chip mounted on the wiring board of the semiconductor device, which is the first embodiment of the present invention.

FIG. 9 is a plan view showing the front surface of the chip 3 to be mounted on the wiring board 1 and FIG. 10 is an enlarged section view of a part of the chip 3.

As shown in FIG. 9, the chip 3 comprises a single crystal silicon substrate, a shape in plan view of which is comprised of a quadrangle, and inside thereof, an integrated circuit (not shown schematically), such as a microcomputer, is formed. Further, on the periphery of the front surface of the chip 3, the bonding pads 4 constituting an external coupling terminal of the integrated circuit are formed. These bonding pads 4 are arranged in two columns and in a staggered manner along each side of the quadrangular chip 3. On the uppermost surface of the chip 3, a surface protection film (passivation film) 30 that protects the integrated circuit is formed. The surface protection film 30 includes, for example, an insulating film in which a silicon oxide film and a silicon nitride film are laminated.

A part of the section of the chip 3 is shown in FIG. 10. As shown in FIG. 10, on the rear surface of the chip 3, for example, a silicon substrate 3P having p-type conductivity is exposed. In the silicon substrate 3P, a p-type well 31 and an element isolation groove 32 are formed and in the p-type well 32, an n-channel type MOS transistor (Qn) is formed. In the actual silicon substrate 3P, other semiconductor elements constituting an integrated circuit (microcomputer), such as a p-channel type MOS transistor, resistor element, and capacitor element, are formed, however, they are not shown schematically.

On the top of the n-channel type MOS transistor (Qn), a wire that couples semiconductor elements is formed. The wire coupling semiconductor elements has a multilayer wire structure, about three to ten layers in general, and in FIG. 10, a three-layer wire (first layer Al wire 33, second layer Al wire 34, third layer Al wire 35) made of a metal film containing an aluminum (Al) alloy as a principal component is shown as an example. Between the n-channel type MIS transistor (Qn) and the first layer Al wire 33, between the first layer Al wire 33 and the second layer Al wire 34, and between the second layer Al wire 34 and the third layer Al wire 35, interlayer insulating films 36, 37, 38 including a silicon oxide film etc. are formed, respectively. Then, the part of the third layer Al wire 35, which exposes from an opening 39 of the surface protection film 30 covering the uppermost surface of the chip 3, constitutes the bonding pad 4.

<Bonding Wire>

Next, the wire 6 that electrically couples the bonding lead 2 of the wiring board 1 and the bonding pad 4 of the chip 3 is explained.

As shown in FIG. 1 to FIG. 3, the semiconductor device (BGA) in the first embodiment employs a multistage loop structure in which the loop of the wire 6 to be coupled to the bonding pads 4 arranged in two columns and in a staggered manner along each side of the chip 3 is formed into a multistage loop.

That is, in the first embodiment, the bonding pad 4 of the bonding pads 4 arranged in two columns and in a staggered manner along each side of the chip 3, which is in the outer column, and the bonding lead 2 of the bonding leads 2 arranged in two columns and in a staggered manner along each side of the wiring board 1, which is in the inner column (column closer to the chip 3), are coupled with the low loop wire 6. Further, the bonding pad 4 in the inner column (column closer to the center of the chip 3) of the chip 3 and the bonding lead 2 in the outer column (column distant from the chip, that is, the column closer to the wiring board 1) of the wiring board 1 are coupled with the high loop wire 6.

In the first embodiment and a second embodiment, to be described later, the bonding pad 4 of the bonding pads 4 arranged in two columns along each side of the chip 3, which is in the outer column and to which the low loop wire (first wire) 6 is coupled, is defined as the first column bonding pad 4 and the bonding pad 4 in the inner columns, to which the high loop wire (second wire) 6 is coupled, is defined as the second column bonding pad 4.

The bonding lead 2 of the bonding leads 2 arranged in two columns along each side of the wiring board 1, which is in the inner column and to which the low loop wire (first wire) 6 is coupled, is defined as the first column bonding lead 2 and the bonding lead 2 in the outer column, to which the high loop wire (second wire) 6 is coupled, is defined as the second column bonding lead 2. That is, the bonding lead 2 that is electrically coupled to the first column bonding pad 4 of the chip 3 via the low loop wire 6 is defined as the first column bonding lead 2 and the bonding lead 2 that is electrically coupled to the second column bonding pad 4 of the chip 3 via the high loop wire 6 is defined as the second column bonding lead 2.

In the present invention, when a multistage loop structure is referred to, it includes not only the two-stage (high loop and low loop) loop structure shown in FIG. 1 to FIG. 3 but also a loop structure with three or more stages, however, in the first embodiment, for the sake of simplification of the explanation and drawings, the case where the two-stage loop structure is employed is explained.

As shown in FIG. 1 and FIG. 3, in the semiconductor device (BGA) in the first embodiment, the diameter of the eight high loop wires 6b of the wires 6 electrically coupling the bonding pad 4 of the chip 3 and the bonding lead 2 of the wiring board 1, which are coupled to the second column bonding pad 4 arranged in the position closest to the corner part of the chip 3, in other words, arranged on both end parts of each side of the chip 3, is made larger than the diameter of the other wires 6. That is, the diameter of the longest wire 6b of the wires 6 electrically coupling the bonding pad 4 of the chip 3 and the bonding lead 2 of the wiring board 1 is made larger than the diameter of the other wires 6. Here, the diameter of the thick wire 6b is, for example, 20 μm and the diameter of the other wires 6 is, for example, 18 μm for both the high loop and the low loop.

As described above, in the semiconductor device (BGA) in the first embodiment, the diameter of the longest wire (corner part wire, end part wire) 6b which is coupled to the second column bonding pad 4 arranged in the position closest to the corner part of the chip 3 is made larger than the diameter of the other wires 6, and thereby, the wire flowing in a molding step, to be described later, is suppressed.

<Method of Manufacturing Semiconductor Device>

Figure 11:
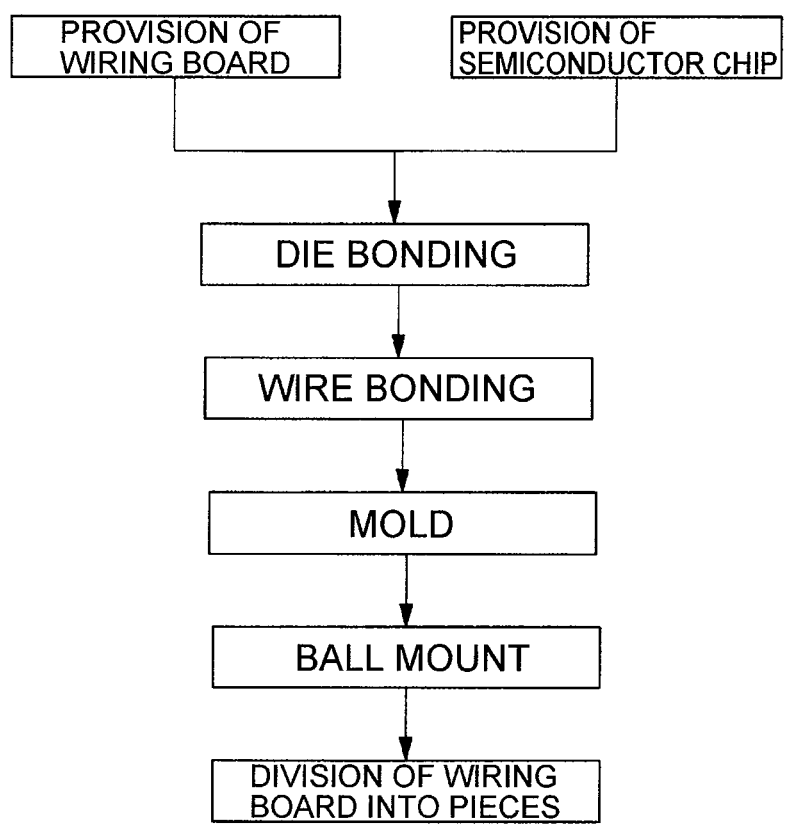
FIG. 11 is a flowchart showing an example of a method of manufacturing the semiconductor device, which is the first embodiment of the present invention, in order of steps.

Next, a method of manufacturing the semiconductor device (BGA) in the first embodiment, which has the above-mentioned configuration, is explained. FIG. 11 is a flowchart showing an example of the method of manufacturing the semiconductor device (BGA) in order of steps.

Figure 12:
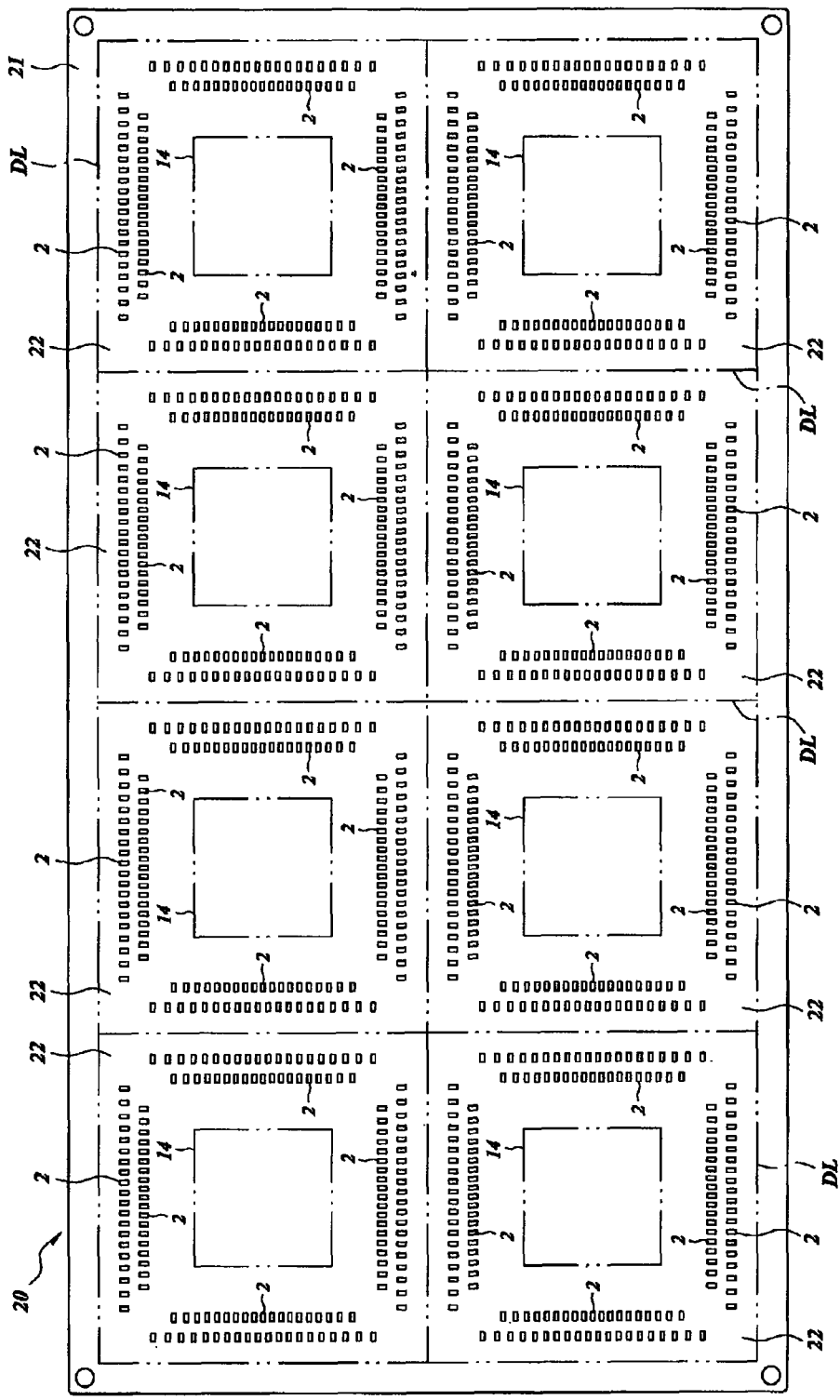
FIG. 12 is a plan view showing an upper surface of a large-sized wiring board used in manufacturing the semiconductor device, which is the first embodiment of the present invention.
Figure 13:
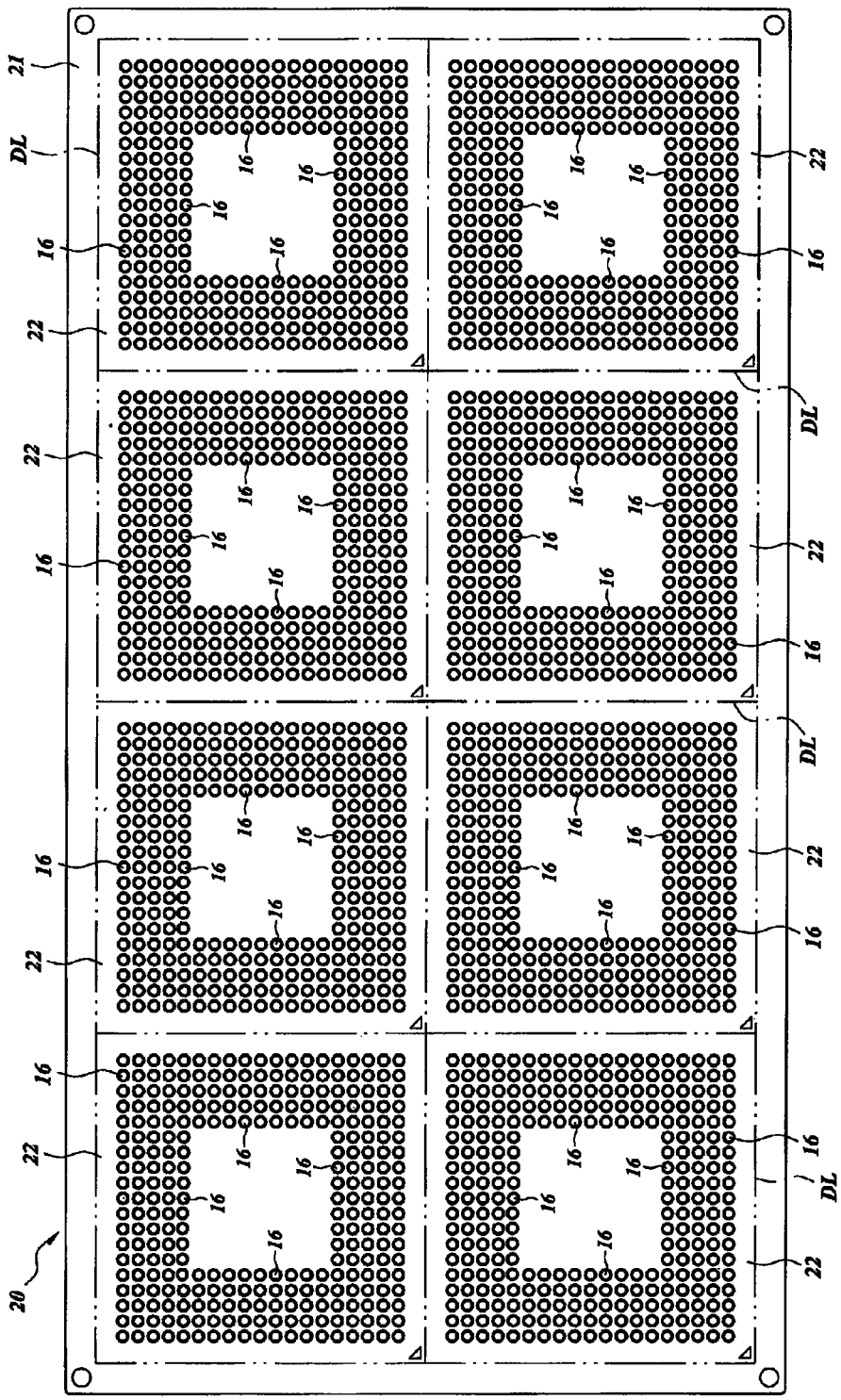
FIG. 13 is a plan view showing a lower surface of the large-sized wiring board used in manufacturing the semiconductor device, which is the first embodiment of the present invention.

1. Step of Providing Substrate and Chip:

FIG. 12 is a plan view showing an upper surface (chip mount surface) of a large-sized wiring board used to manufacture a semiconductor device and FIG. 13 is a plan view showing a lower surface of the large-sized wiring board.

A large-sized wiring board 20 comprises a rectangular (quadrangular) frame part 21 and a plurality of device regions 22 provided within the frame part 21. Here, the device region 22 is a region, a shape in plan view of which is comprised of a quadrangle, defined by a virtual dicing line DL shown by a two-dot chain line in FIG. 12 and FIG. 13.

The large-sized wiring board 20 is a multilayer wiring board, which serves as a mother body of the wiring board 1, and has a configuration in which a plurality of the wiring boards 1 is obtained by dicing and dividing the large-sized wiring board 20 into pieces along the dicing line DL. The number of the device regions 22 provided in the large-sized wiring board 20 is not limited in particular. For example, the large-sized wiring board 20 shown in FIG. 12 and FIG. 13 comprises device regions 22 in two rows×four columns, and therefore, the wiring boards 1 in the number of 2×4=8 are obtained from the large-sized wiring board 20. The large-sized wiring board 20 is sometimes called a MAP (Mold Array Package) substrate or multi-wire substrate.

On the upper surface of the large-sized wiring board 20, at the central part of the device regions 22, respectively, the quadrangular chip mount region 14 is provided and outside the chip mount region 14, the bonding leads 2 arranged in two columns and in a staggered manner along each side of the chip mount region 14 are formed. On the lower surface of the large-sized wiring board 20, in the device regions 22, respectively, the lands 16 are formed in an array (in a matrix). The section structure of the device region 22 is the same as that of the wiring board 1 shown in FIG. 7. Consequently, each of the eight device regions 22 provided on the large-sized wiring board 20 has the same structure as that of one wiring board 1.

Figure 14:
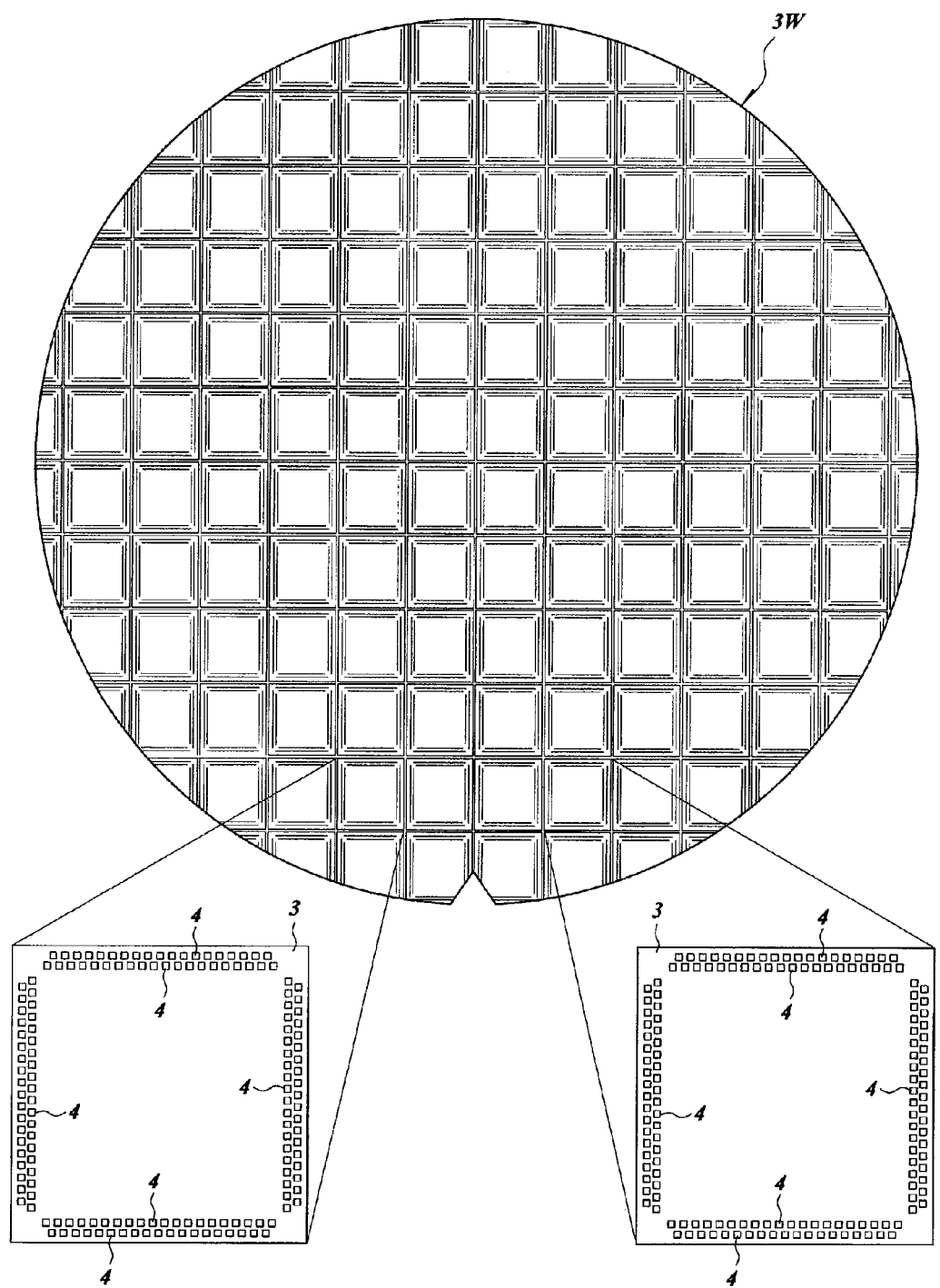
FIG. 14 is a plan view of a semiconductor wafer used in manufacturing the semiconductor device, which is the first embodiment of the present invention.

In parallel with the step of providing the large-sized wiring board 20, the chips 3 are provided by dicing and dividing a semiconductor wafer 3W shown in FIG. 14 into pieces. In each of the regions (chip regions) in an array defined by the semiconductor wafer 3W, an integrated circuit, such as a microcomputer, is formed, however, such an integrated circuit can be formed in a normal wafer process (preprocess), and therefore, its detailed explanation is omitted.

Figure 15:
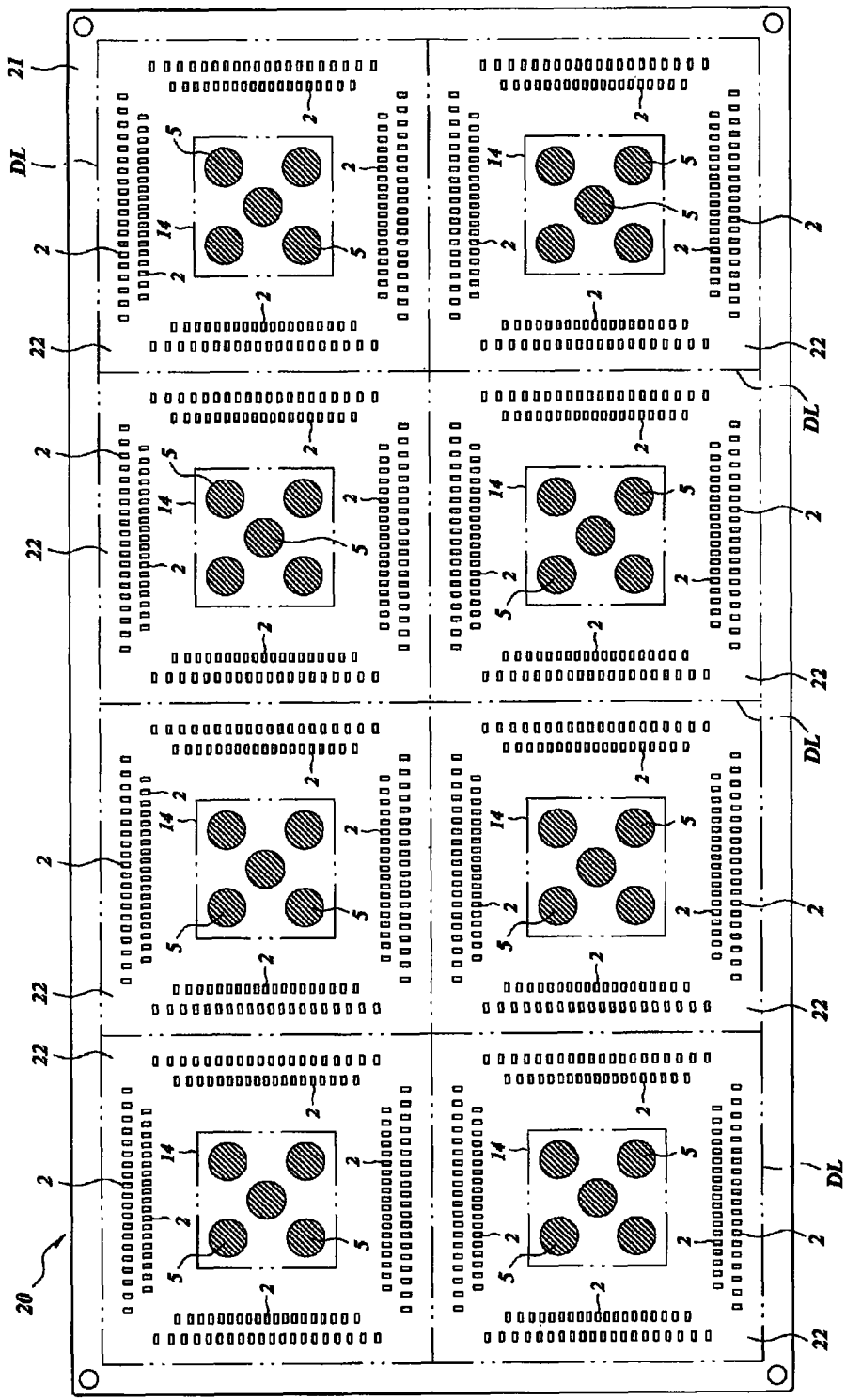
FIG. 15 is a plan view of the large-sized wiring board showing a method of manufacturing the semiconductor device, which is the first embodiment of the present invention.
Figure 16:
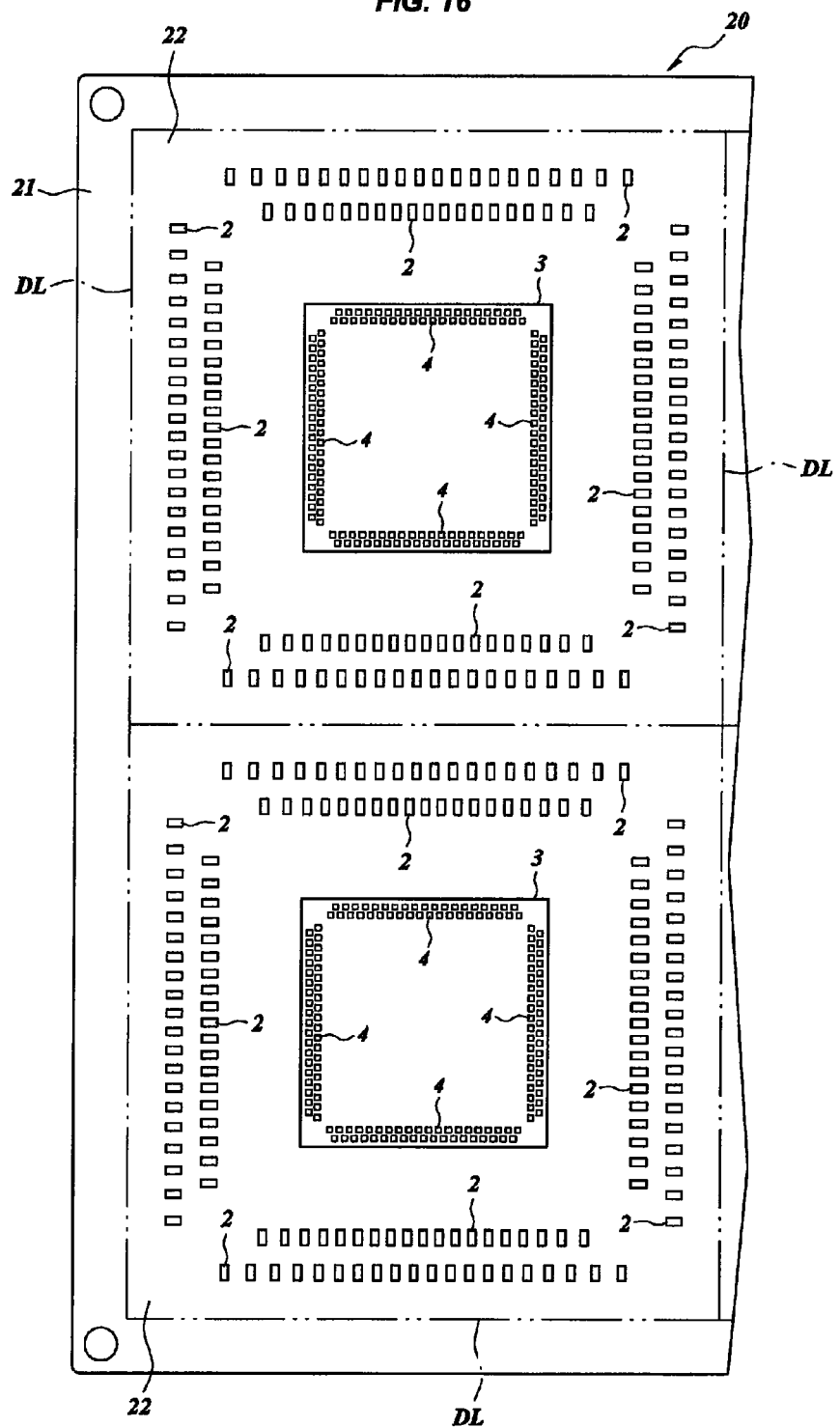
FIG. 16 is a partially enlarged plan view of the large-sized wiring board showing the method of manufacturing the semiconductor device, following FIG. 15.

2. Die Bonding Step:

In order to manufacture the semiconductor device (BGA), first, as shown in FIG. 15, the adhesive 5 is supplied to the chip mount region 14 in each of the device regions 22 provided on the upper surface of the large-sized wiring board 20, and then, as shown in FIG. 16 (plan view showing a part of the large-sized wiring board 20 in an enlarged view), the chip 3 is mounted at the central part (the chip mount region 14 to which the adhesive 5 is supplied) in each of the device regions 22. Mounting of the chip 3 is performed by face-up mounting, in which the rear surface of the chip 3 is made to oppose the upper surface of the large-sized wiring board 20. After that, the large-sized wiring board 20 is heated and the adhesive is hardened, and thereby, each of the chips 3 is fixed on the upper surface of the large-sized wiring board 20.

Figure 17:
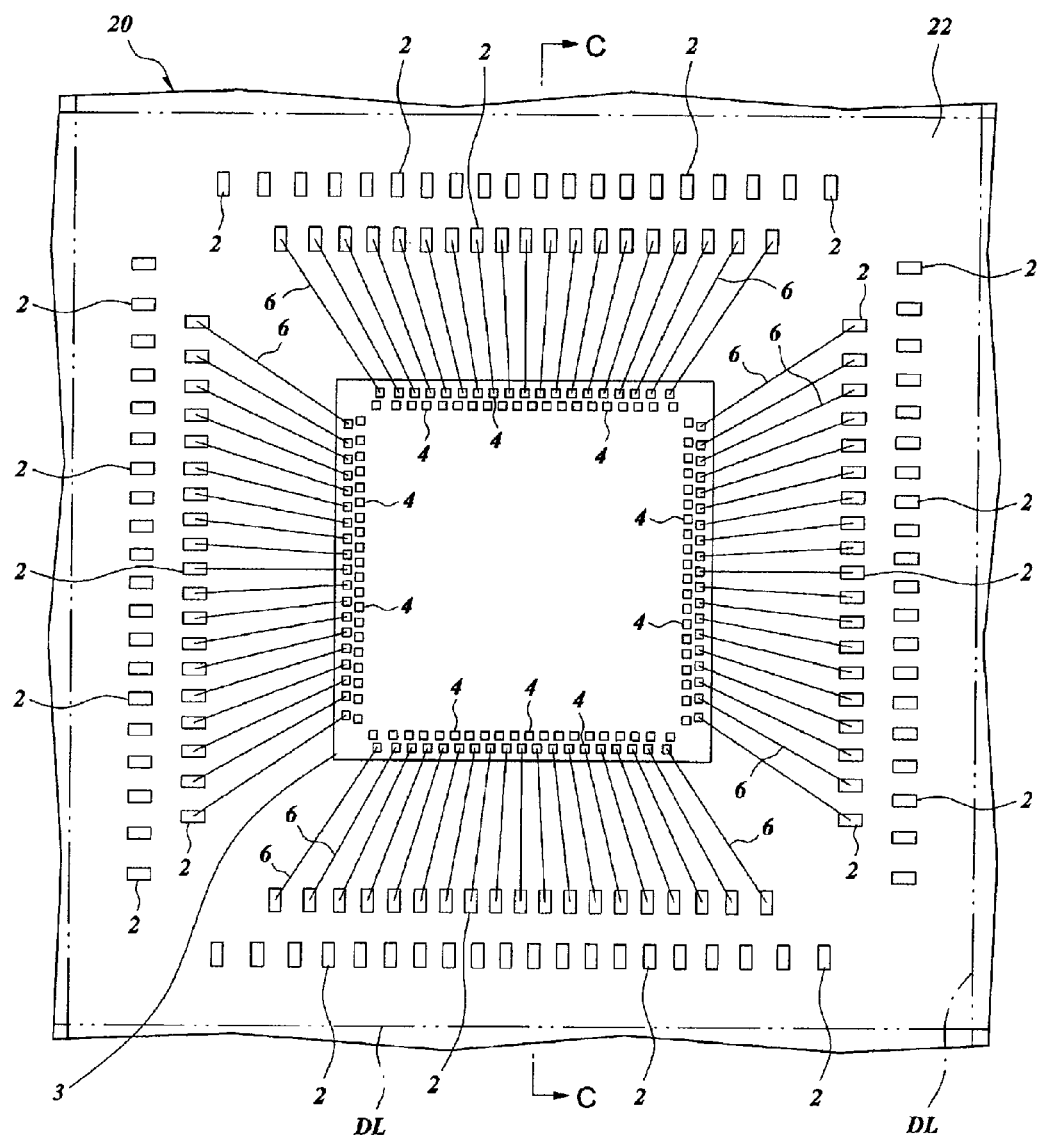
FIG. 17 is a partially enlarged plan view of the large-sized wiring board showing the method of manufacturing the semiconductor device, following FIG. 16.
Figure 18:
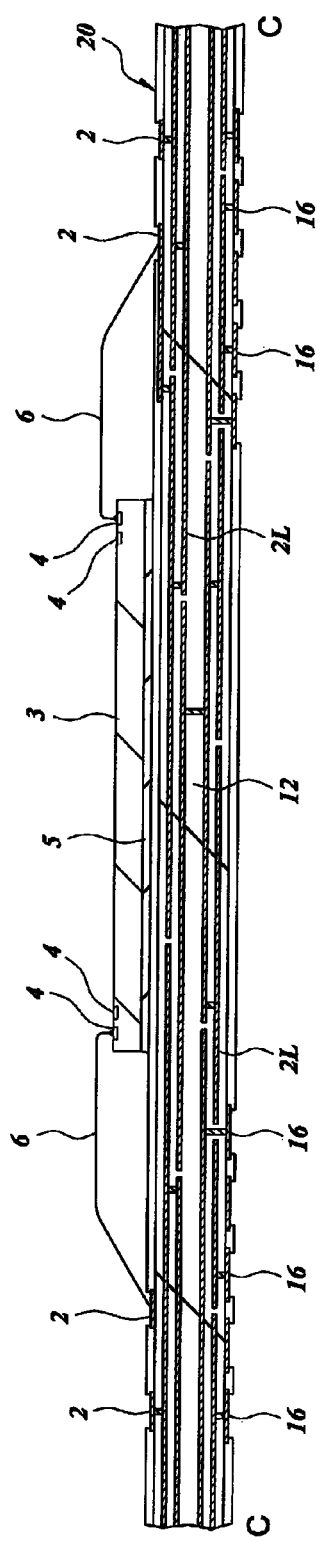
FIG. 18 is a section view along C-C line in FIG. 17.

3. Wire Bonding Step:

Next, as shown in FIG. 17 (plan view showing the device region 22 of the large-sized wiring board 20 in an enlarged view) and FIG. 18 (section view along C-C line in FIG. 17), the first column bonding pad 4 of the chip 3 mounted in each of the device regions 22 of the large-sized wiring board 20 and the first column bonding lead 2 formed in each of the device regions 22 are electrically coupled with the low loop wire 6. Bonding of the wire 6 is performed by the well-known ball bonding method that utilizes heat and ultrasonic waves and a forward bonding method is employed, in which the first bonding is performed on the side of the bonding pad 4 and the second bonding is performed on the side of the bonding lead 2. That is, first, a ball part is formed at the tip end part of the wire 6 and after the ball part is coupled to the bonding pad 4, the other end of the wire 6 is coupled to the bonding lead 2. At this time, the diameter of the wire 6 used is, for example, 18 μm.

Figure 19:
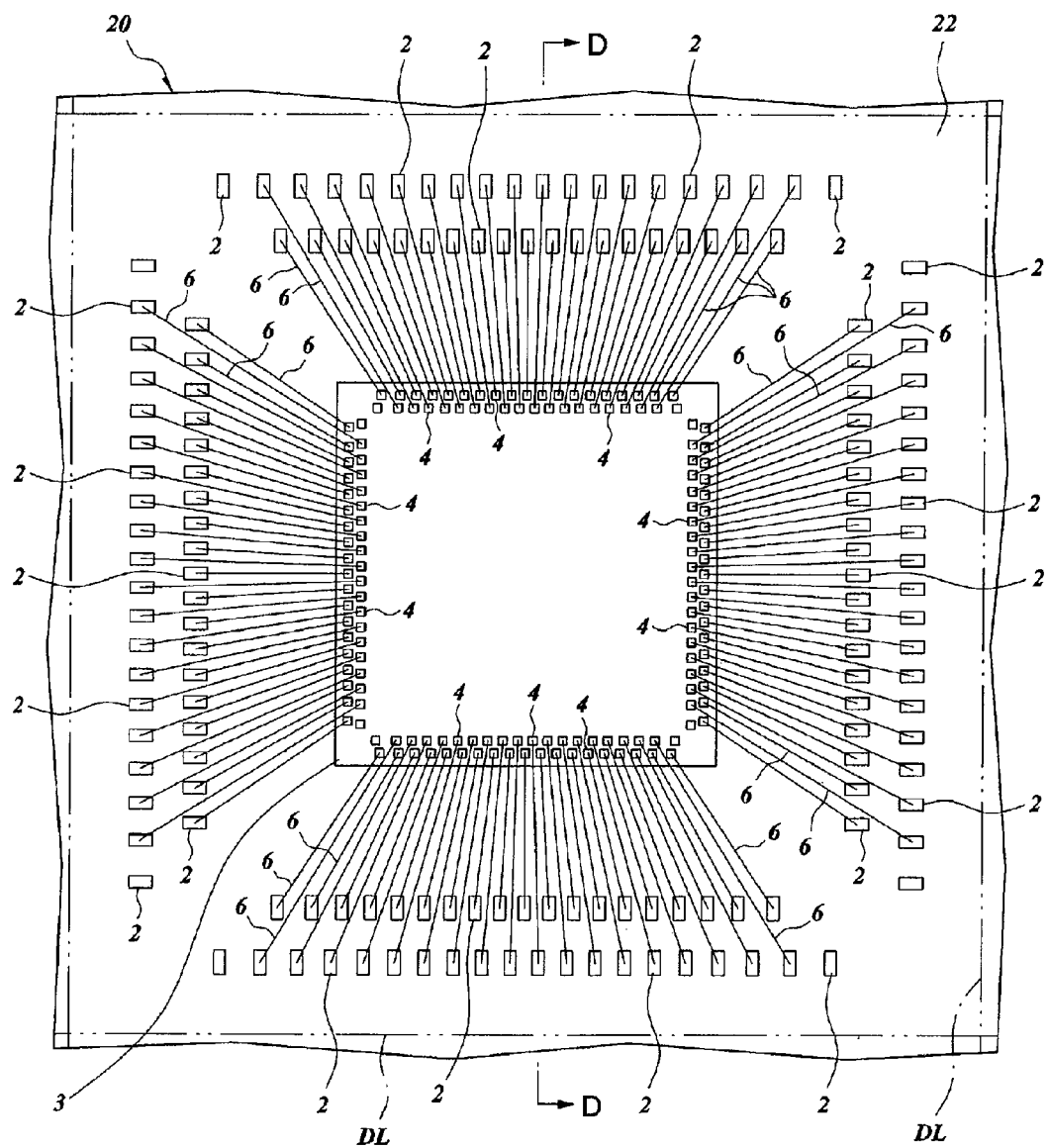
FIG. 19 is a partially enlarged plan view of the large-sized wiring board showing the method of manufacturing the semiconductor device, following FIG. 17.
Figure 20:
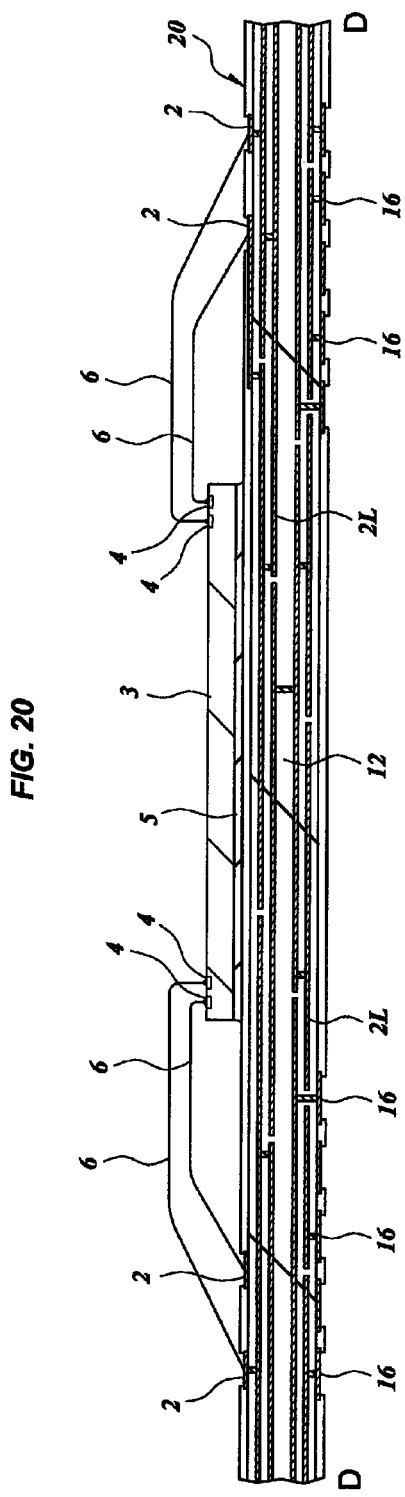
FIG. 20 is a section view along D-D line in FIG. 19.

Next, as shown in FIG. 19 (plan view showing one of the device regions 22 of the large-sized wiring board 20 in an enlarged view) and FIG. 20 (section view along D-D line in FIG. 19), the second column bonding pad 4 of the chip 3 mounted in each of the device regions 22 of the large-sized wiring board 20 and the second column bonding lead 2 formed in each of the device regions 22 are electrically coupled with the high loop wire 6. However, at this time, the wire 6 is not coupled to the second column bonding pad 4 arranged in the position closest to the corner part of the chip 3 or to the second column bonding lead 2 corresponding to the bonding pad 4.

For the bonding of the high loop wire 6, the same wire bonder used for the bonding of the low loop wire 6 is used. In this case also, the forward bonding method is employed, in which the first bonding is performed on the side of the bonding pad 4 and the second bonding is performed on the side of the bonding lead 2. The diameter of the high loop wire 6 is the same as that of the low loop wire 6 (for example, 18 μm).

Figure 21:
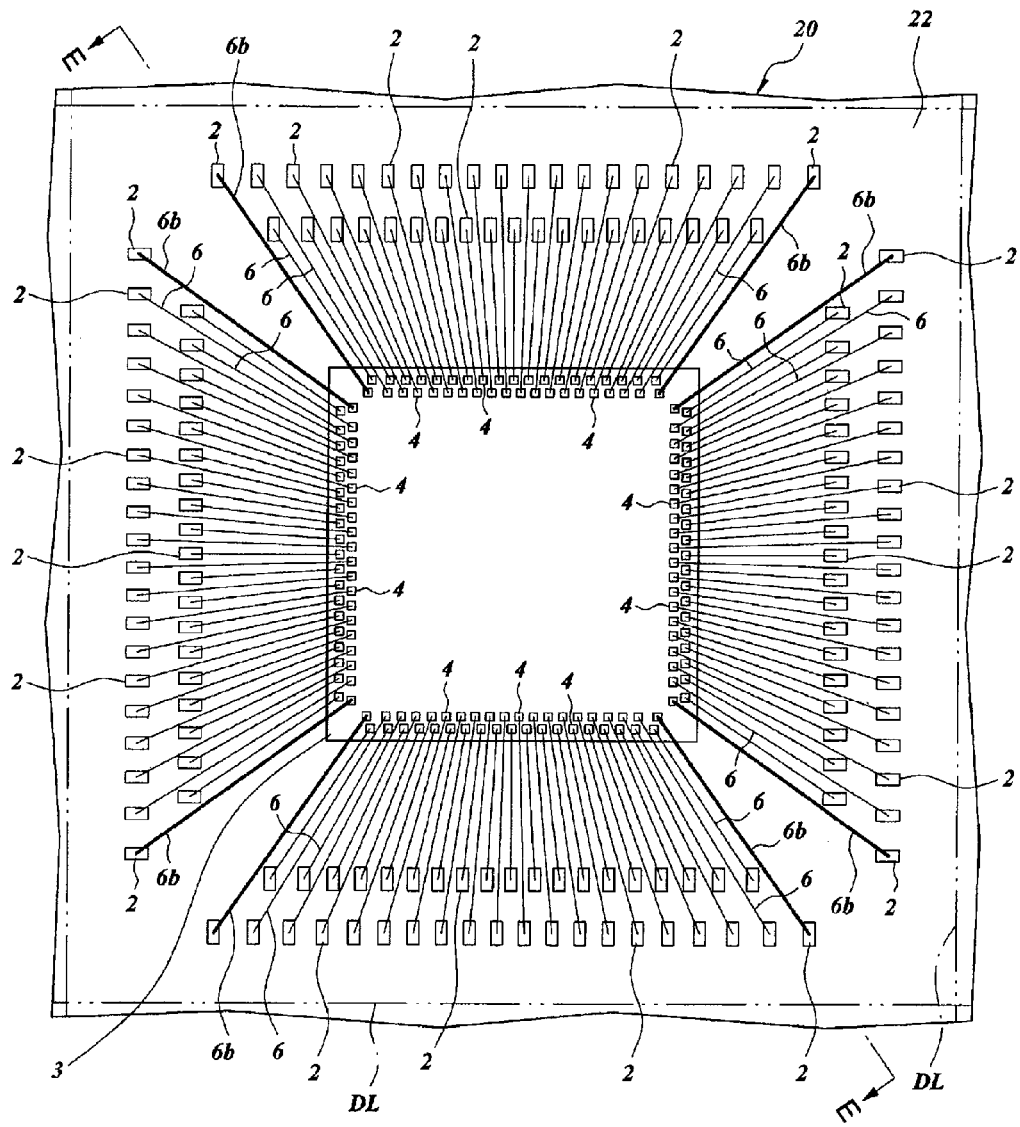
FIG. 21 is a partially enlarged plan view of the large-sized wiring board showing the method of manufacturing the semiconductor device, following FIG. 19.
Figure 22:
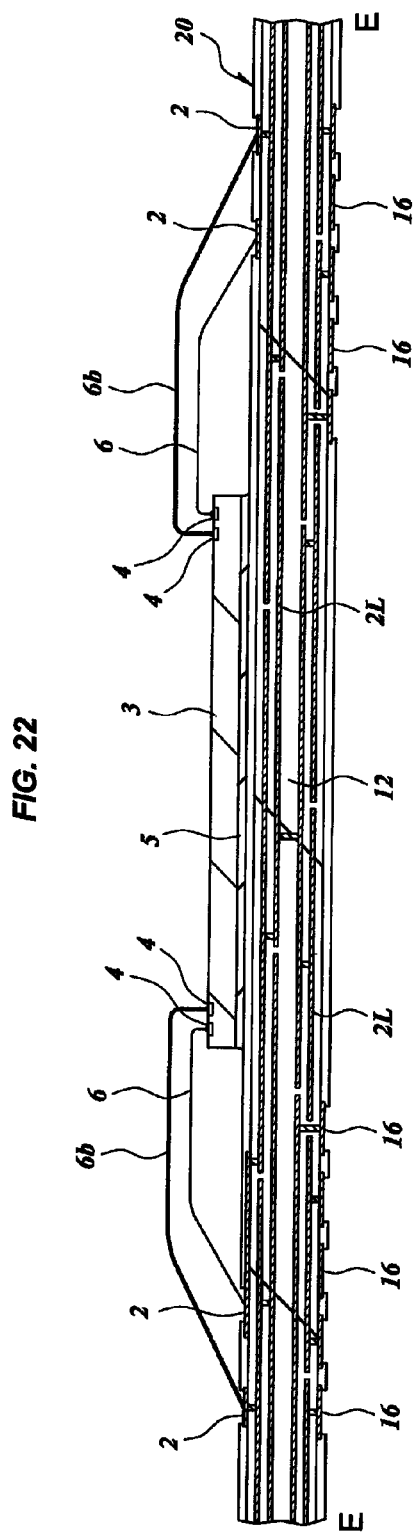
FIG. 22 is a section view along E-E line in FIG. 21.

Next, as shown in FIG. 21 (plan view showing one of the device regions 22 of the large-sized wiring board 20 in an enlarged view) and FIG. 22 (section view along E-E line in FIG. 21), the second column bonding pad 4 arranged in the position closest to the corner part of the chip 3 and the second column bonding lead 2 corresponding to the bonding pad 4 are electrically coupled with the high loop wire 6b having the diameter larger than that of the wire 6.

In this case also, the forward bonding method is employed, in which the first bonding is performed on the side of the bonding pad 4 and the second bonding is performed on the side of the bonding lead 2, however, for the bonding of the wire 6b with a large diameter, a wire bonder different from that used for the bonding of the wire 6 with a small diameter is used. The diameter of the wire 6b with a large diameter is, for example, 20 μm.

Figure 23:
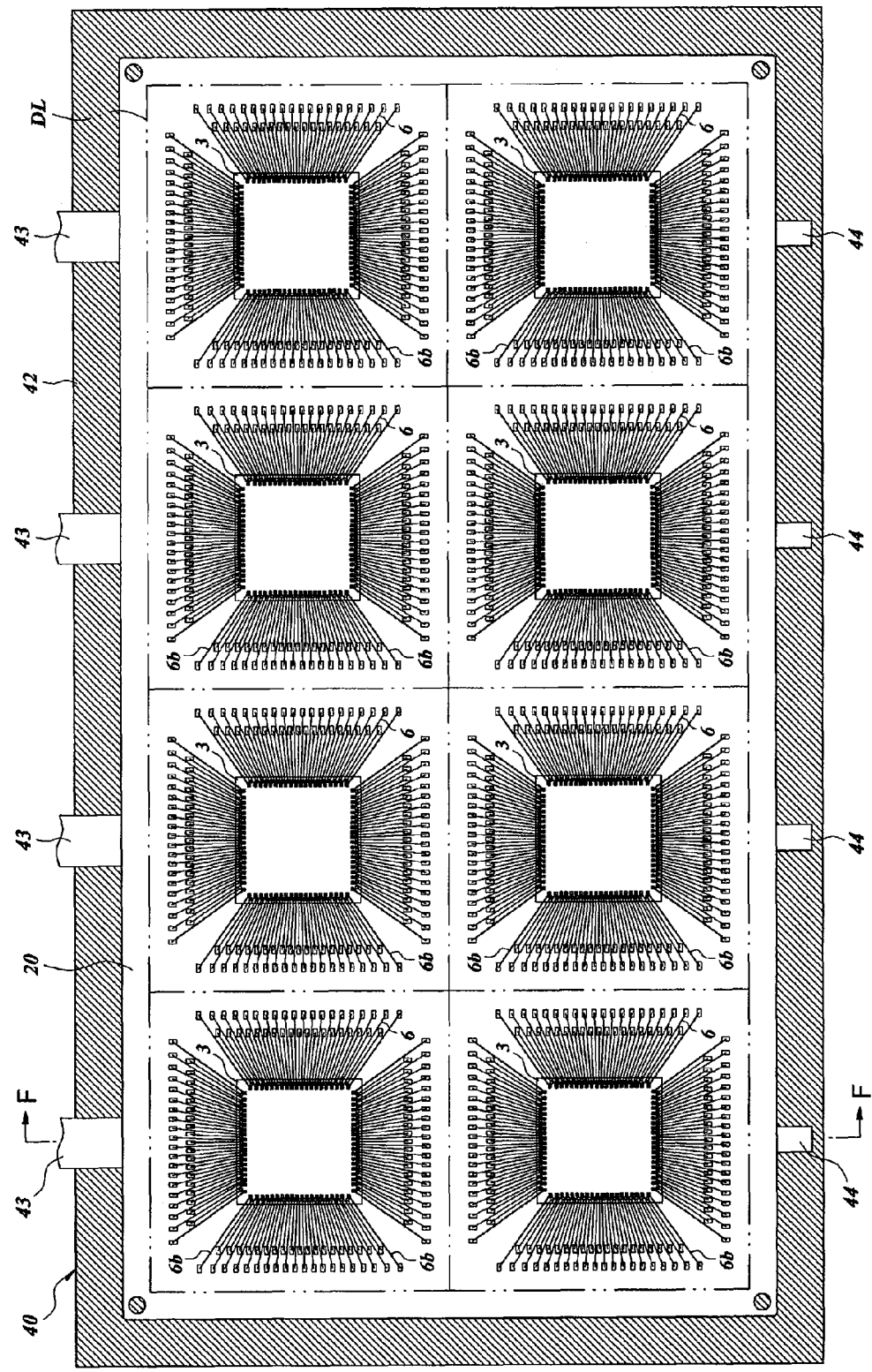
FIG. 23 is a plan view of a molding die and the large-sized wiring board showing the method of manufacturing the semiconductor device, following FIG. 21.
Figure 24:
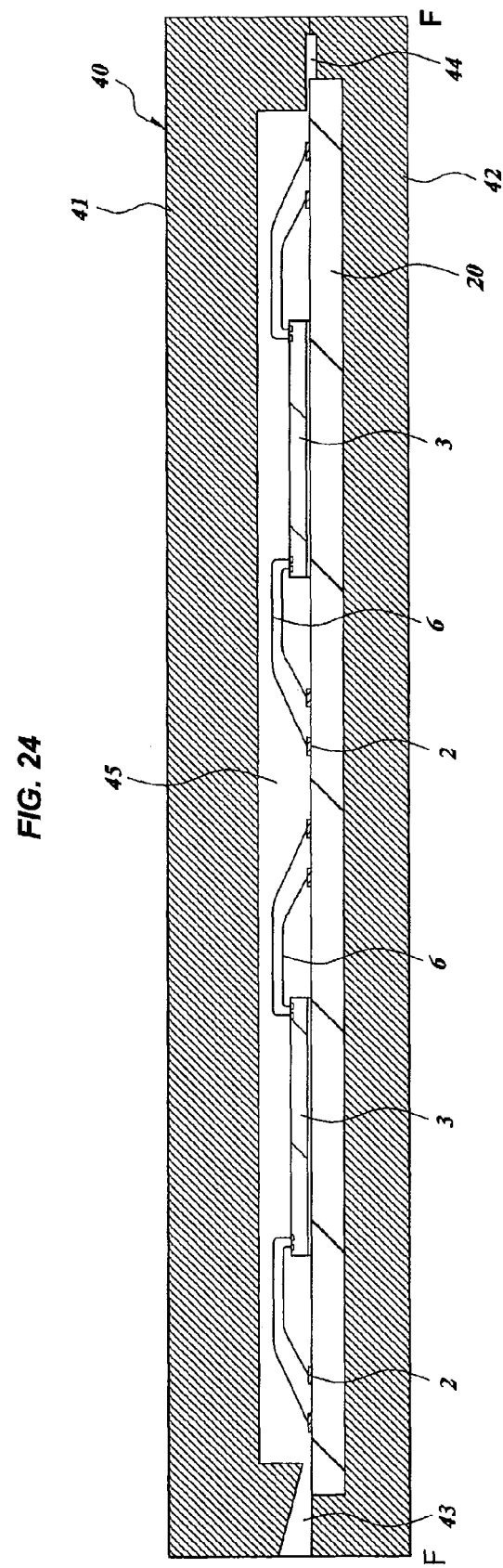
FIG. 24 is a section view along F-F line in FIG. 23.

4. Molding Step:

Next, the large-sized wiring board 20 for which the wire bonding step has been completed is attached to a molding die 40 shown in FIG. 23 and FIG. 24. FIG. 23 is a plan view showing the molding die 40 used in the first embodiment and the large-sized wiring board 20 attached to the molding die 40 and FIG. 24 is a section view along F-F line in FIG. 23.

The molding die 40 includes an upper die 41 having a cavity 45 provided therein and a lower die 42 in opposition to the upper die 41. The large-sized wiring board 20 is fixed on the upper surface of the lower die 42 such that its upper surface is located within the cavity 45. On one of the long sides of the upper die 41 of the cavity 45 of the molding die 40, a shape in plan view of which is comprised of a quadrangle, a plurality of gates 43 to supply a resin (sealing resin 8) in a molten state into the cavity 45 is provided. On the other long side in opposition to the above-mentioned long side of the upper die 41, a plurality of air vents 44 to discharge a gas within the cavity 45 is provided. That is, the molding die 40 employs a so-called side gate system, in which a resin in a molten state is injected from one side of the quadrangular cavity 45 to another side in opposition to the side.

As shown in FIG. 23, when the large-sized wiring board 20 is attached to the molding die 40, the long side of the quadrangular large-sized wiring board 20 becomes parallel with the long side of the upper die 41 provided with the gate 43 and the air vent 44 and the short side of the large-sized wiring board 20 becomes parallel with the short side of the upper die 41. Two sides of the four sides of the quadrangular chip 3 mounted in each of the device regions 22 of the large-sized wiring board 20 become parallel with the long side of the upper die 41 and the remaining two sides become perpendicular to the long side of the upper die 41. In other words, two sides of the four sides of the chip 3 become parallel with the direction of the flow of the resin injected into the cavity 45 and the remaining two sides become perpendicular to the direction of the resin flow.

Figure 25:
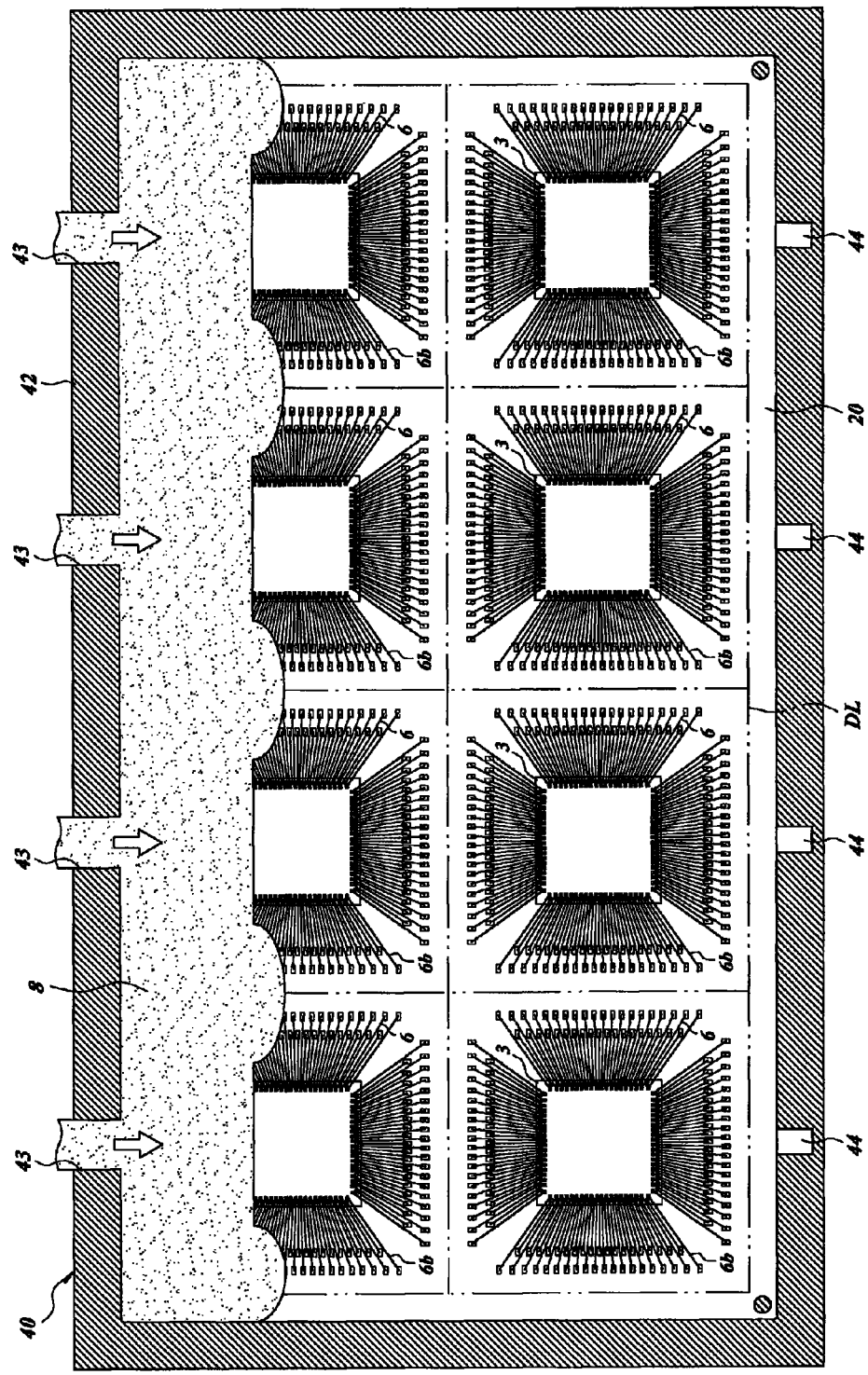
FIG. 25 is a plan view of the molding die and the large-sized wiring board showing the method of manufacturing the semiconductor device, following FIG. 23.
Figure 26:
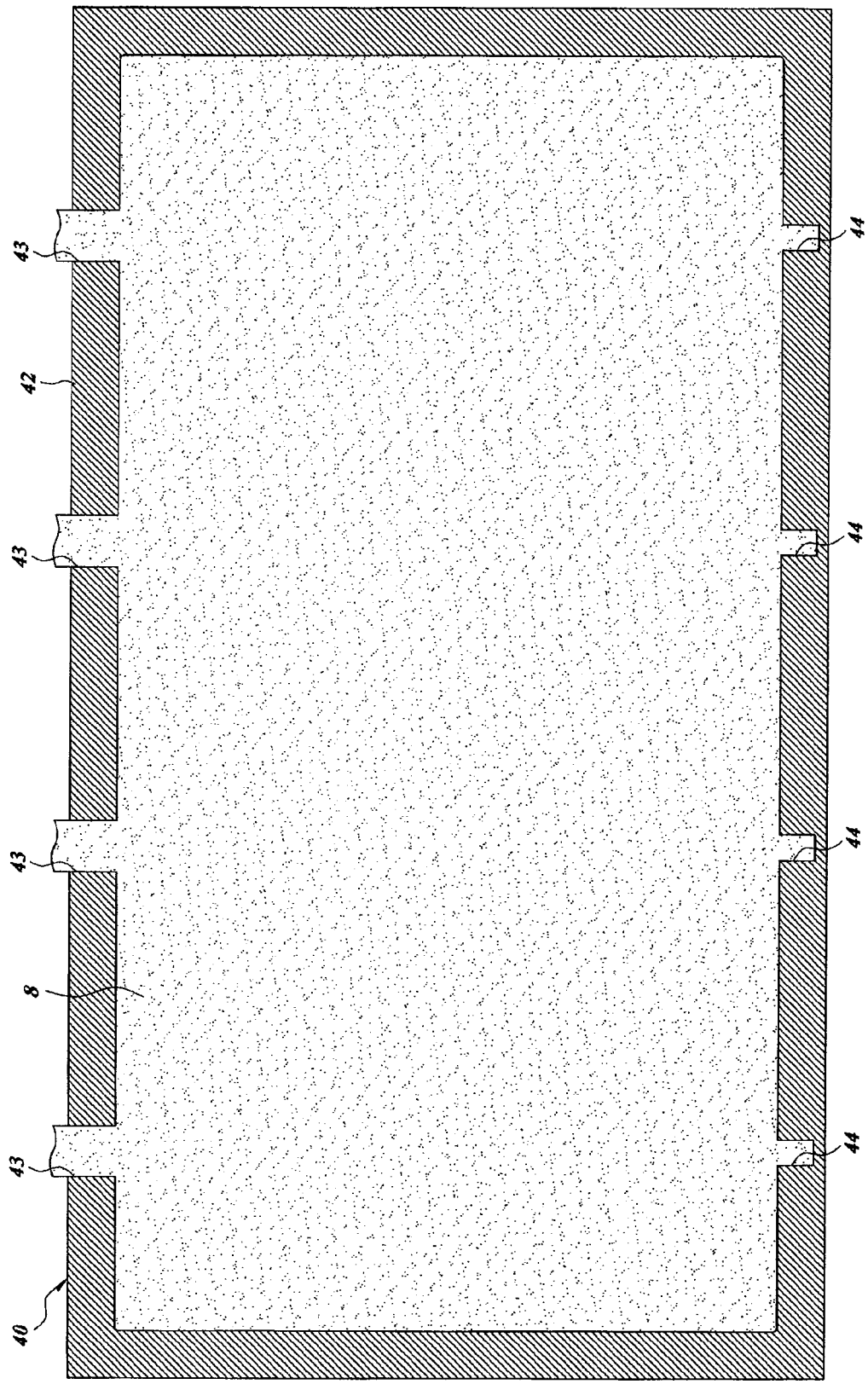
FIG. 26 is a plan view of the molding die and the large-sized wiring board showing the method of manufacturing the semiconductor device, following FIG. 25.

Next, as shown in FIG. 25 and FIG. 26, by injecting the sealing resin 8 in a molten state into the cavity 45 through the gates 43, all the chips 3 mounted on the upper surface of the large-sized wiring board 20 and all the wires 6, 6b coupled thereto are molded all together with the sealing resin 8. Here, FIG. 25 is a plan view showing the flow of the sealing resin 8 immediately after injected into the cavity 45 through the gate 43. FIG. 26 is a plan view showing the state where the cavity 45 is filled completely with the sealing resin 8 afterward.

As described above, in the wire bonding step prior to the molding step, the second column bonding pad 4 arranged in the position closest to the corner part of the chip 3 mounted in each of the device regions 22 of the large-sized wiring board 20 and the second column bonding lead 2 corresponding to the bonding pad 4 are electrically coupled with the wire 6b larger in diameter, and therefore, higher in rigidity than the other wires 6 (see FIG. 21, FIG. 22). That is, in the first embodiment, the diameter of the longest wire (corner part wire) 6b of the wires 6, 6b electrically coupling the bonding pad 4 of the chip 3 and the bonding lead 2 of the large-sized wiring board 20 is made larger than that of the other wires 6.

Consequently, when the sealing resin 8 is injected into the cavity 45 of the molding die 40, the deformation (transverse and longitudinal deformation) of the longest wire (corner wire) 6b, and therefore, the most likely to deform is suppressed, and therefore, a short circuit between the wire 6b and the low loop wire 6 neighboring the wire 6b is suppressed.

5. Ball Mount Step

Figure 27:
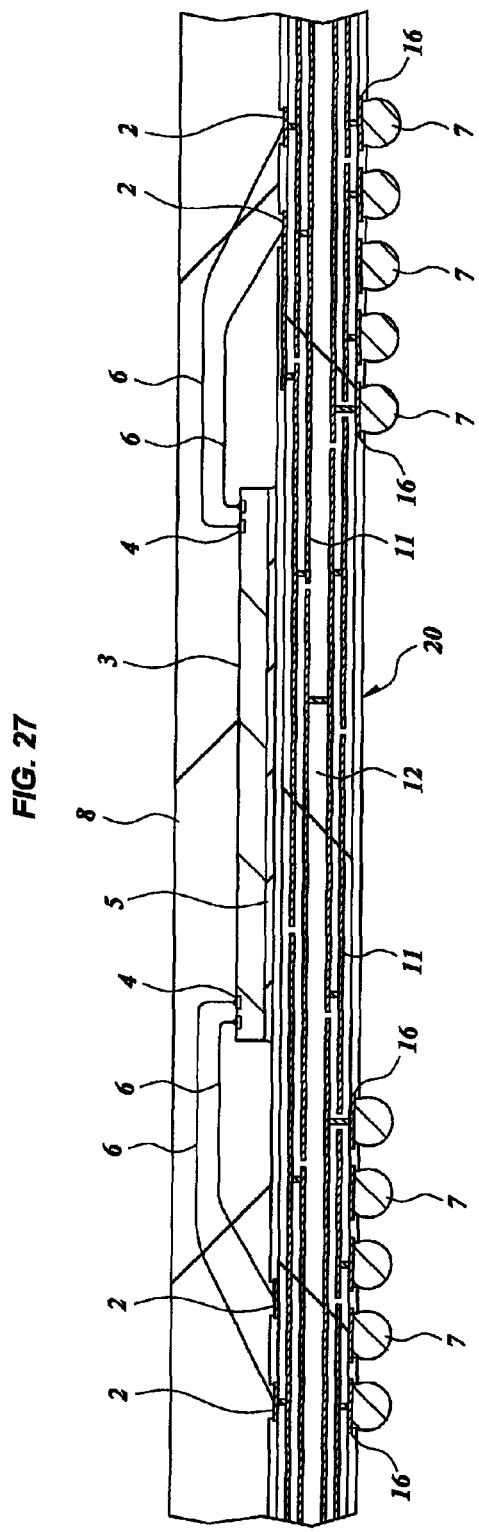
FIG. 27 is a partial section view of the large-sized wiring board showing the method of manufacturing the semiconductor device, following FIG. 26.

Next, as shown in FIG. 27, the solder ball 7 is coupled to the lands 16, respectively, formed on the lower surface of the large-sized wiring board 20.

6. Dividing Step

Figure 28:
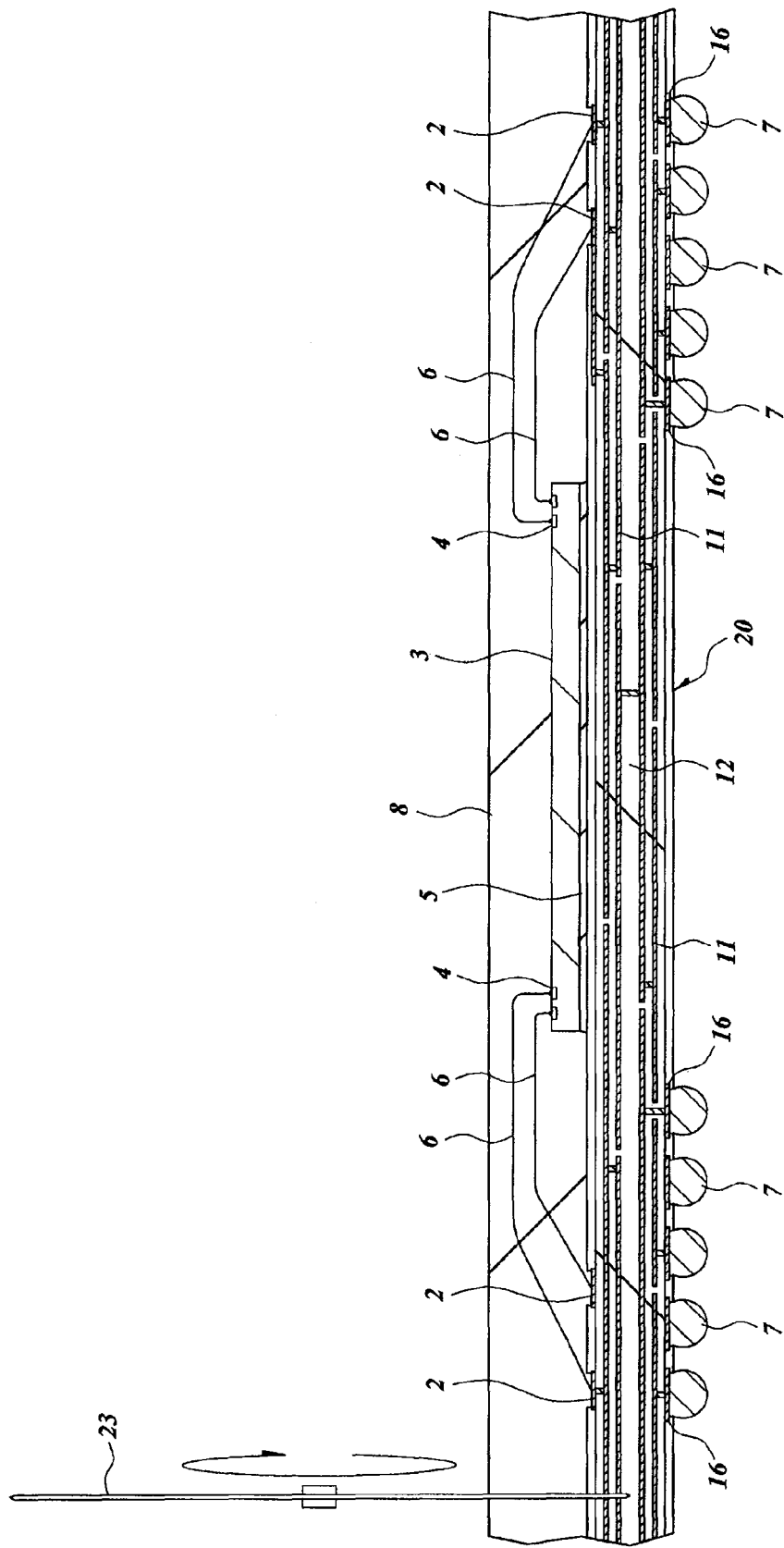
FIG. 28 is a partial section view of the large-sized wiring board showing the method of manufacturing the semiconductor device, following FIG. 27.

Next, as shown in FIG. 28, the large-sized wiring board 20 and the sealing resin 8 covering the entire upper surface thereof are diced and divided into pieces using a dicing blade 23. The dicing of the large-sized wiring board 20 and the sealing resin 8 is performed along the dicing line DL shown in FIG. 12 and FIG. 13. By the steps hitherto, the semiconductor device (BGA) in the first embodiment shown in FIG. 1 to FIG. 4 is completed.

As described above, according to the first embodiment, it is possible to suppress the longest wire (corner part wire) 6b arranged in the position closest to the corner part of the chip 3 from deforming (wire flowing) by the flow pressure of the sealing resin 8 at the time of molding. Due to this, it is possible to suppress the short circuit between the wire (corner part wire) 6b and the low loop wire 6 neighboring the wire 6b, and therefore, it is possible to improve the reliability and the manufacture yields of the semiconductor device (BGA).

Further, in the first embodiment, only the diameter of the longest wire (corner part wire) 6b of the high loop wires 6, 6b coupling the second column bonding pad 4 of the wiring board 1 and the second column bonding pad 4 of the chip 3 is made larger. Due to this, the amount of the wires 6, 6b to be consumed can be saved compared to the case where the diameter of all the high loop wires 6, 6b is made larger than the diameter of the low loop wire 6. Consequently, particularly when expensive gold is used as the material of the wires 6, 6b, it is possible to remarkably reduce the material costs of the semiconductor device (BGA).

(Second Embodiment)

In the first embodiment described above, the short circuit between the neighboring wires 6, 6b is suppressed by making larger the diameter of the longest wire (corner part wire) 6b of the wires 6, 6b coupling the bonding pad 4 of the wiring board 1 and the bonding pad 4 of the chip 3 than that of the other wires 6. In contrast to this, in a second embodiment, the short circuit between the neighboring wires 6, 6b is suppressed by using only the wires 6 having a small diameter and modifying the wire bonding method. The material of the wire 6 used in the second embodiment is gold, the same as in the first embodiment. The diameter of the wire 6 is, for example, 18 µm. Hereinafter, with reference to FIG. 29 to FIG. 33, the wire bonding method in the second embodiment is explained.

Figure 29:
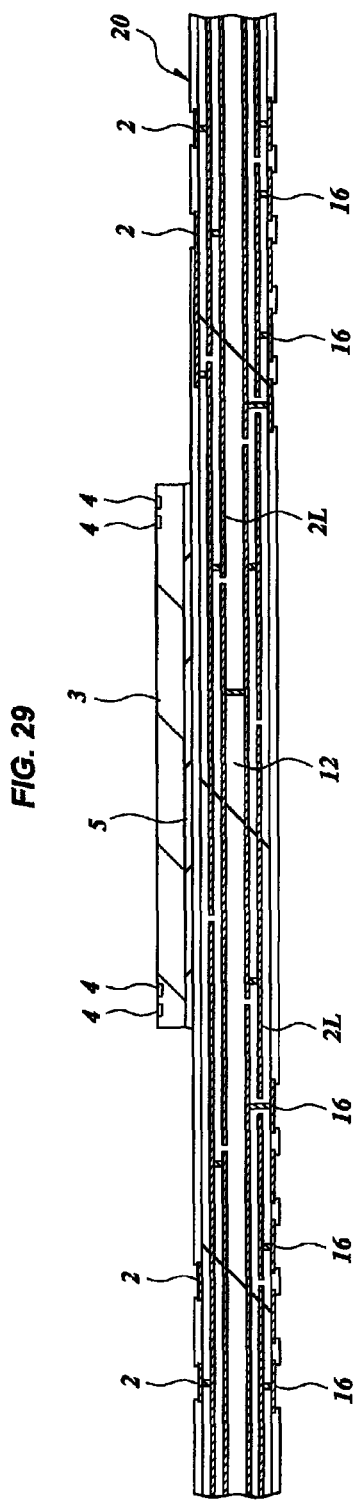
FIG. 29 is a partial section view of a large-sized wiring board showing a method of manufacturing a semiconductor device, which is a second embodiment of the present invention.

FIG. 29 is a section view showing a part (one of the eight device regions 22 shown in FIG. 12 and FIG. 13) of the large-sized wiring board 20 for which the die bonding step has been completed. The die bonding step in the second embodiment is the same as the die bonding step in the first embodiment, and therefore, its explanation is omitted.

Figure 30:
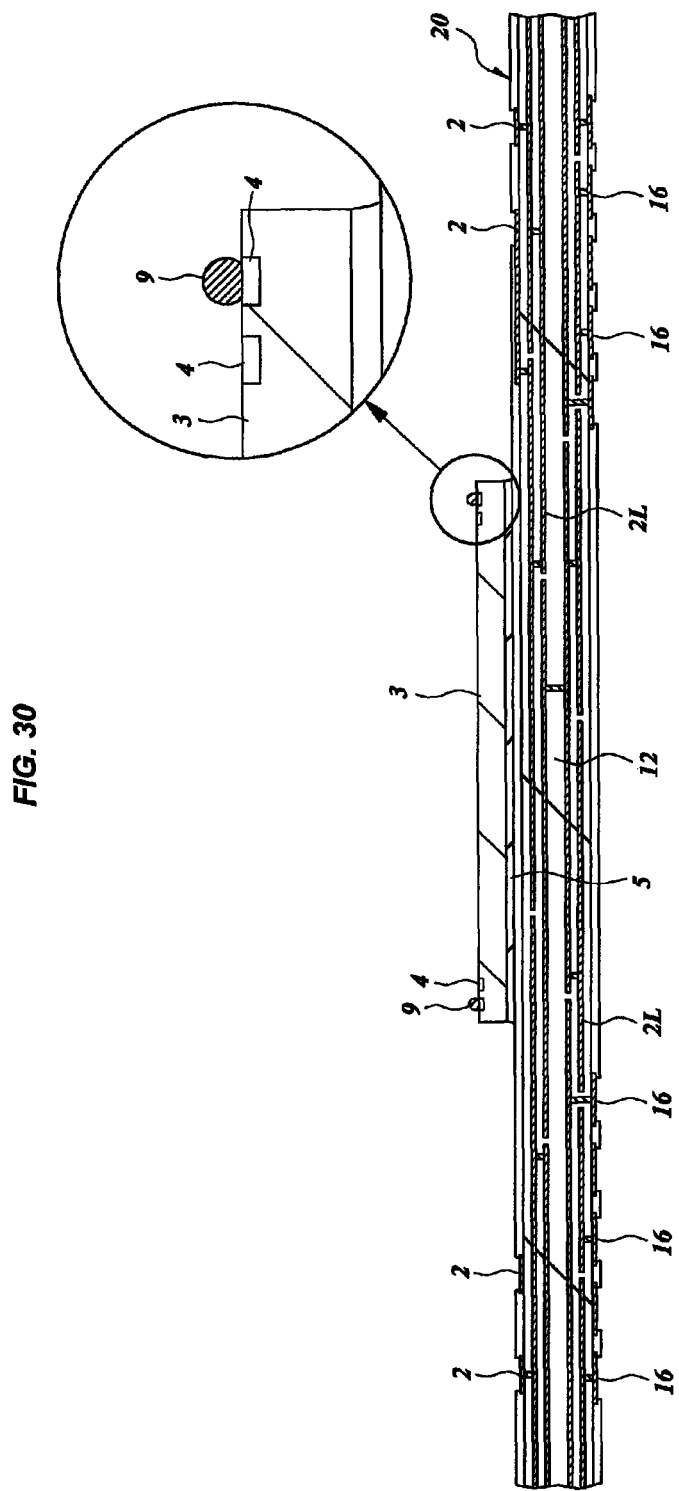
FIG. 30 is a partial section view of the large-sized wiring board showing the method of manufacturing the semiconductor device, following FIG. 29.

Next, the first column bonding pad 4 of the chip 3 mounted on the upper surface of the large-sized wiring board 20 and the first column bonding lead 2 formed on the upper surface of the large-sized wiring board 20 are electrically coupled with the low loop wire 6. The bonding of the wire 6 is performed by the well-known ball bonding method that utilizes heat and ultrasonic waves and in the second embodiment, first, as shown in FIG. 30, a gold projecting electrode 9 is coupled to the first column bonding pad 4 of the chip 3. That is, first, a ball part is formed at the tip end part of the wire 6 and the ball part is coupled to the first column bonding pad 4, and then, the wire 6 is cut, and thus, the projecting electrode 9 including the ball part is formed over the first column bonding pad 4.

Figure 31:
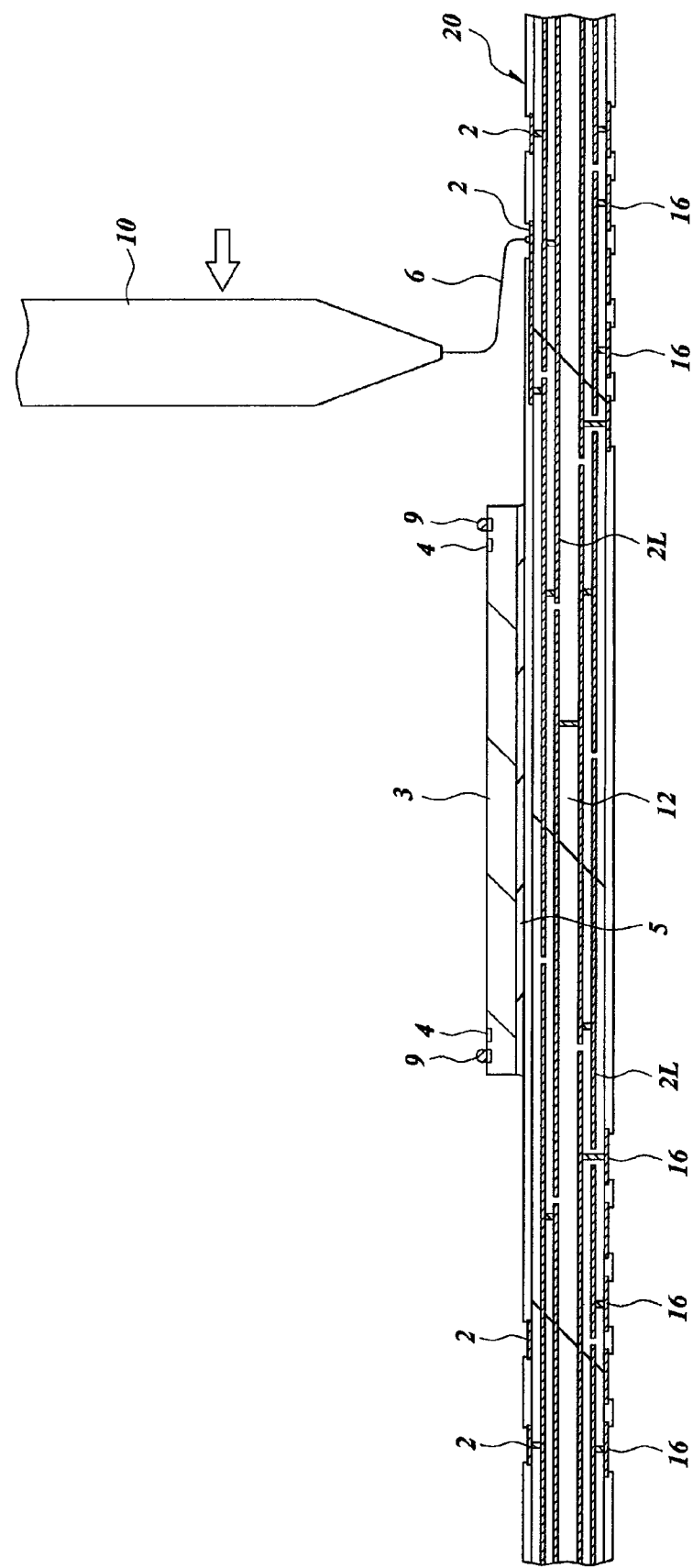
FIG. 31 is a partial section view of the large-sized wiring board showing the method of manufacturing the semiconductor device, following FIG. 30.
Figure 32:
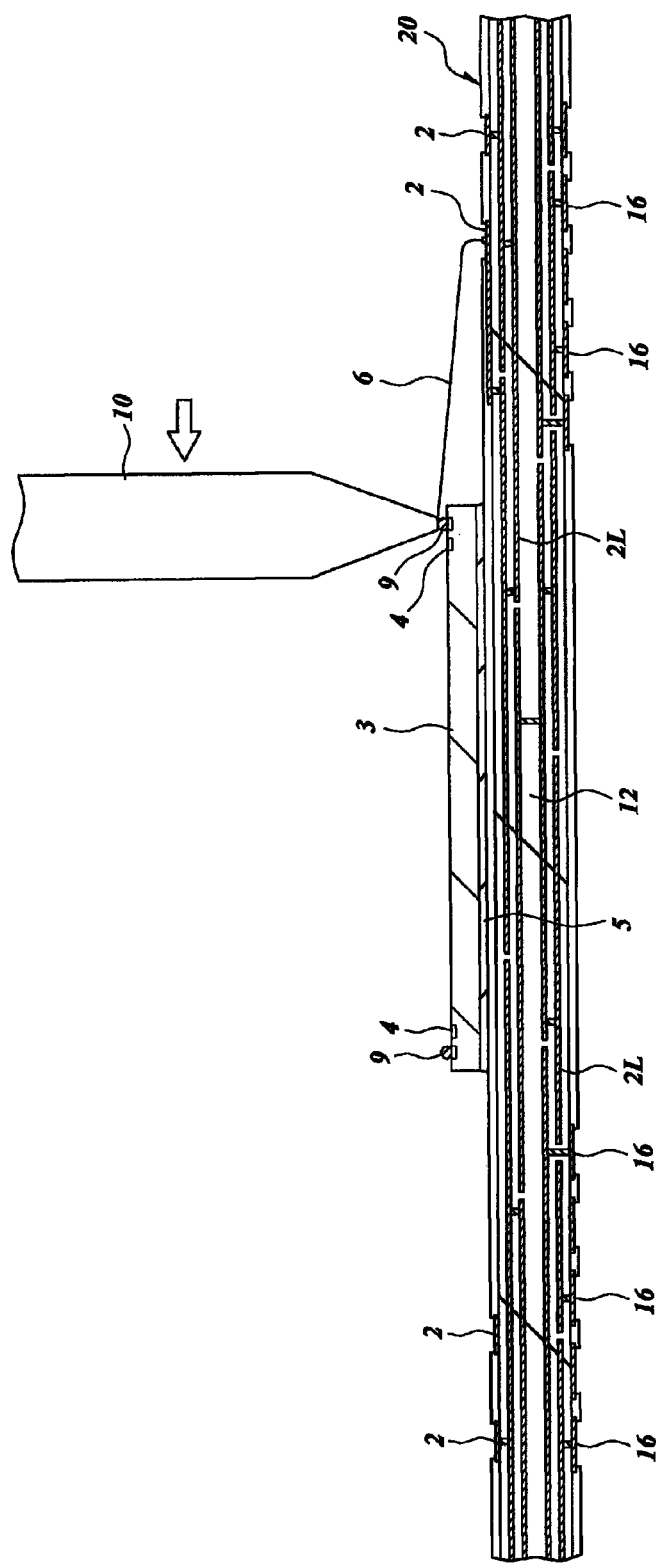
FIG. 32 is a partial section view of the large-sized wiring board showing the method of manufacturing the semiconductor device, following FIG. 31.

Next, as shown in FIG. 31, after coupling one end (ball part) of the wire 6 to the first column bonding lead 2, a capillary 10 is moved over the first column bonding pad 4 and the other end of the wire 6 is coupled to the projecting electrode 9 as shown in FIG. 32.

Figure 33:
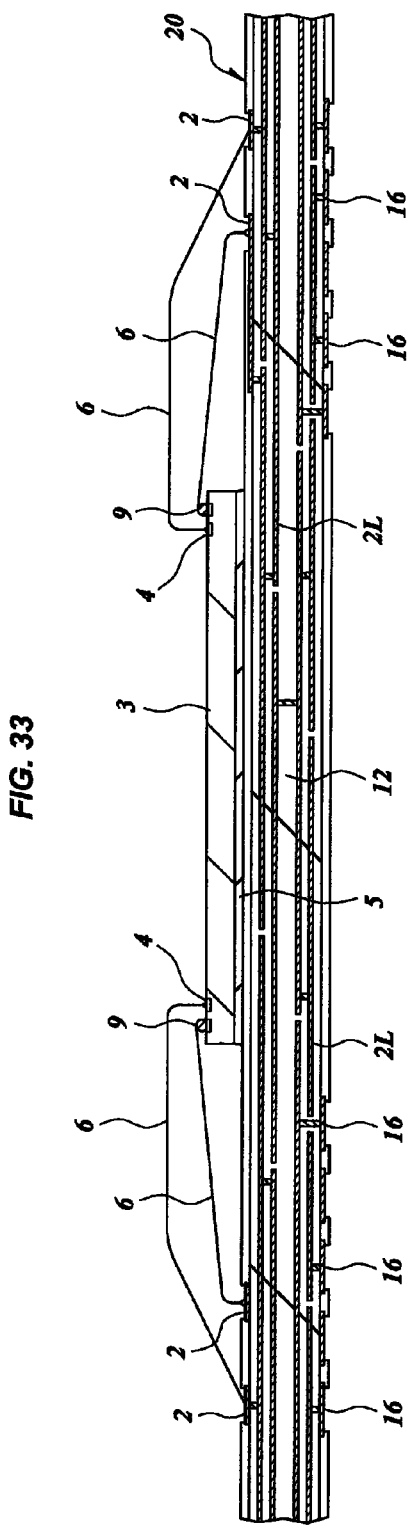
FIG. 33 is a partial section view of the large-sized wiring board showing the method of manufacturing the semiconductor device, following FIG. 32.

In this manner, after electrically coupling all the first column bonding pads 4 of the chip 3 and the first column bonding leads 2 of the large-sized wiring board 20 with the low loop wires 6, the second column bonding pad 4 of the chip 3 and the second column bonding lead 2 of the large-sized wiring board 20 are electrically coupled with the high loop wire 6 as shown in FIG. 33. The bonding of the high loop wire 6 is performed by the forward bonding method as in the first embodiment, in which the first bonding is performed on the side of the bonding pad 4 and the second bonding is performed on the side of the bonding lead 2. The diameter of all the high loop wires 6 is made the same as that of the low loop wire 6 (for example, 18 µm) including all the high loop wires 6 to be coupled to the second column bonding pad 4 arranged in the position closest to the corner part of the chip 3.

As described above, in the second embodiment, when electrically coupling the first column bonding pad 4 of the chip 3 and the first column bonding lead 2 of the large-sized wiring board 20 with the low loop wire 6, a reverse bonding method is employed. Due to this, as shown in FIG. 33, the loop height of the low loop wire 6 becomes smaller than the height of the low loop wire 6 formed by the method (forward bonding method) in the first embodiment, and therefore, the distance (distance in the vertical direction) between the high loop wire 6 and the low loop wire 6 neighboring the high loop wire 6 is increased.

Consequently, even if the high loop wire 6 (the longest wire 6) coupled to the second column bonding pad 4 arranged in the position closest to the corner part of the chip 3 deforms in the molding step, it is possible to suppress the short circuit with the neighboring low loop wire 6.

Further, by forming the projecting electrode 9 in advance over the first column bonding pad 4 when electrically coupling the first column bonding pad 4 of the chip 3 and the first column bonding lead 2 of the large-sized wiring board 20 with the low loop wire 6, it is possible to improve the reliability of coupling between the wire 6 having a very small loop height and the first column bonding pad 4. Furthermore, the projecting electrode 9 interposed between the wire 6 and the first column bonding pad 4 relaxes/absorbs the impact of bonding, and therefore, it is possible to suppress boding damage to the integrated circuit formed on the chip 3.

(Modified Example)

In the first embodiment 1, in all the chips 3 mounted on the upper surface of the large-sized wiring board 20, the diameter of the high loop wire (corner part wire) 6b arranged in the position (both end parts of each side of the chip 3) closest to the corner part of the chip 3 is made larger than the diameter of the other wires 6, however, the present invention is not limited to this.

For example, when sealing the chip 3 and the wires 6, 6b over the large-sized wiring board 20 with a resin using the molding die 40 of the side gate system shown in FIG. 23 and FIG. 24, the distance from the front surface of the chip 3 to the lower surface of the upper die 41 becomes shorter than the distance from the upper surface of the large-sized wiring board 20 to the lower surface of the upper die 41 as shown in FIG. 24. In other words, the gap between the front surface of the chip 3 and the lower surface of the upper die 41 becomes narrower than the gap between the upper surface of the large-sized wiring board 20 and the lower surface of the upper die 41.

Because of that, as shown in FIG. 25, when injecting the sealing resin 8 into the cavity 45 through the gate 43, the speed of the sealing resin 8 flowing through the gap between the front surface of the chip 3 and the lower surface of the upper die 41 becomes slower than the speed of the sealing resin 8 flowing through the gap between the upper surface of the large-sized wiring board 20 and the lower surface of the upper die 41.

Figure 34:
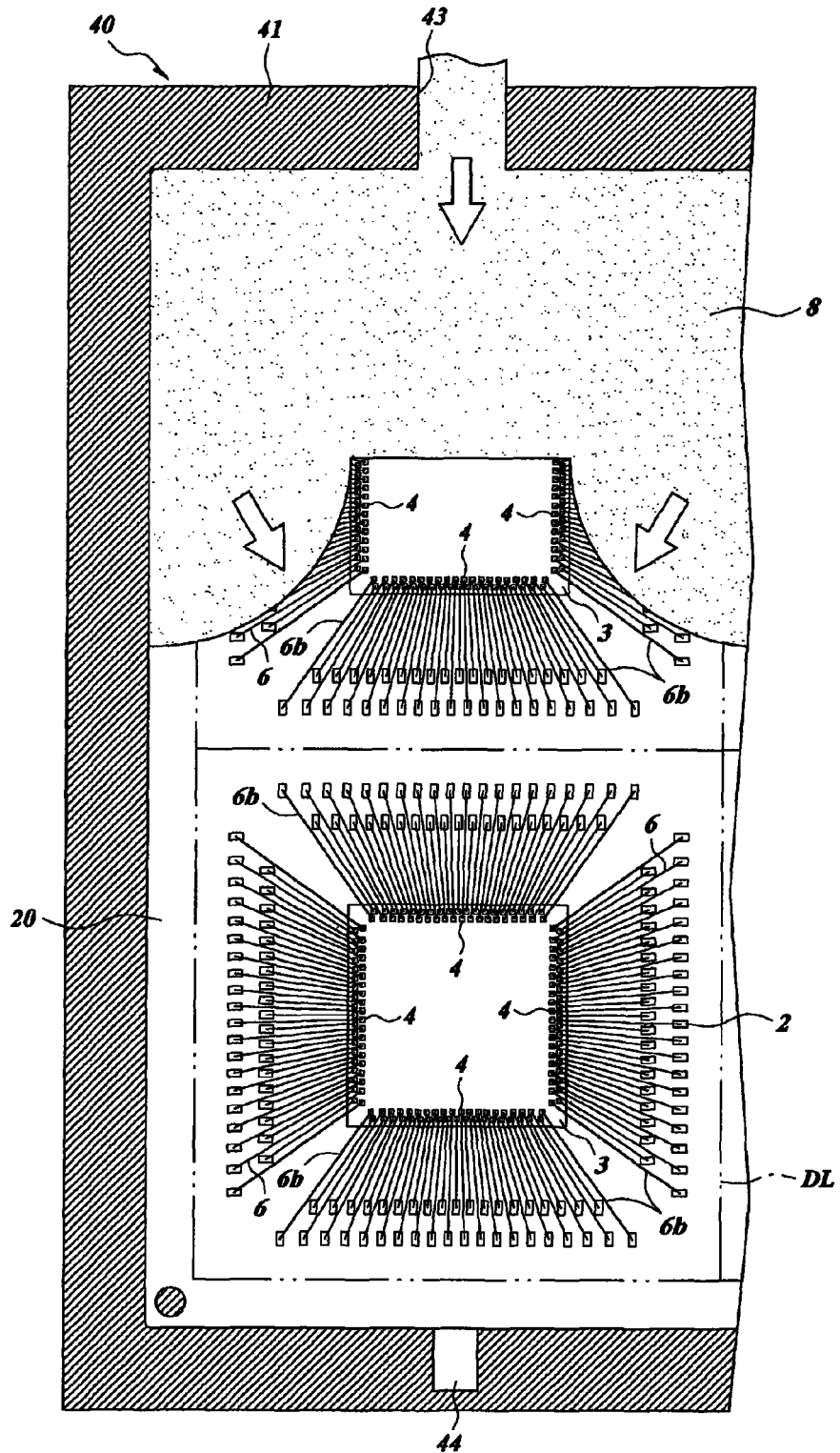
FIG. 34 is a partial plan view for explaining a flow of a sealing resin injected into a cavity of the molding die shown in FIG. 23 and FIG. 24.

As a result of that, as shown in FIG. 34, at the two corner parts of the corner parts of the chip 3, which are located on the side closer to the air vent 44 of the molding die 40, a strong flow pressure of the sealing resin 8 is applied to the high loop wire (corner part wire) 6b in the transverse direction (direction of arrows). That is, when sealing the chip 3 and the wires 6, 6b over the large-scaled wiring board 20 with a resin using the molding die 40 of the side gate system, the wire 6b of the high loop wires (corner part wires) 6b arranged in the vicinity of the four corner parts (four corners) of the chip 3, which is arranged in the vicinity of the two corner parts located on the side closer to the air vent 44, is more likely to deform than the wire 6b of the high loop wires (corner part wires) 6b arranged in the vicinity of the four corner parts (four corners) of the chip 3, which is arranged in the vicinity of the two corner parts located on the side closer to the gate 43.

Figure 35:
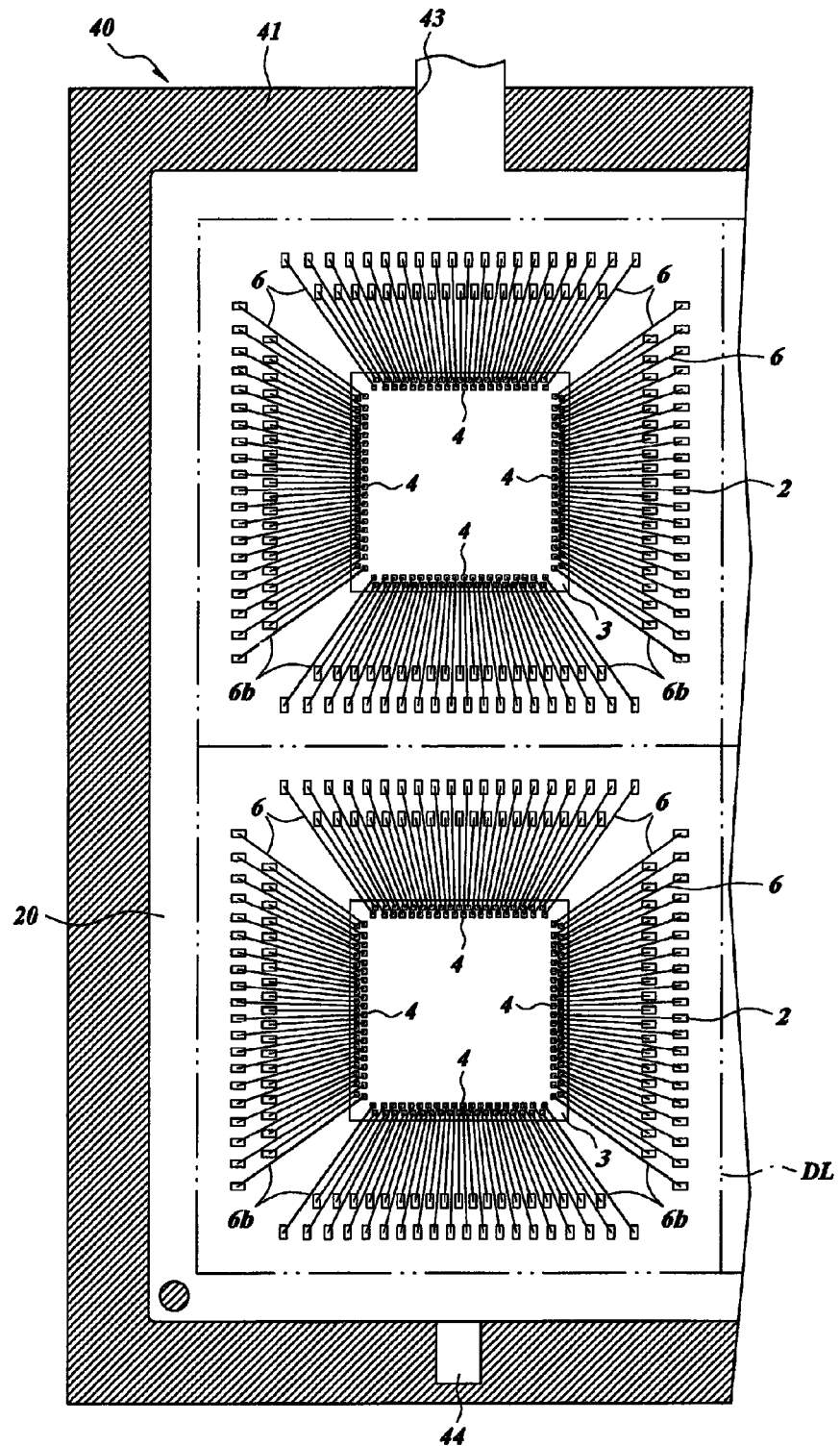
FIG. 35 is a partial plan view of a molding die and a large-sized wiring board showing a semiconductor device, which is a modified example of the present invention.

Because of the above, as shown in FIG. 35, in all the chips 3 mounted on the upper surface of the large-scaled wiring board 20, only the diameter of the high loop wires (corner part wires) 6b arranged in the vicinity of the two corner parts located on the side closer to the air vent 44 is made larger and the diameter of the other wires 6 may be reduced.

Further, the flow pressure of the sealing resin 8 applied to the high loop wire (corner part wire) 6b explained in FIG. 34 is higher in the chip 3 of the chips 3 mounted on the upper surface of the large-scaled wiring board 20, which is located in the row closer to the air vent 44, than in the chip 3 of the chips 3 mounted on the upper surface of the large-scaled wiring board 20, which is located in the row closer to the gate 43.

Figure 36:
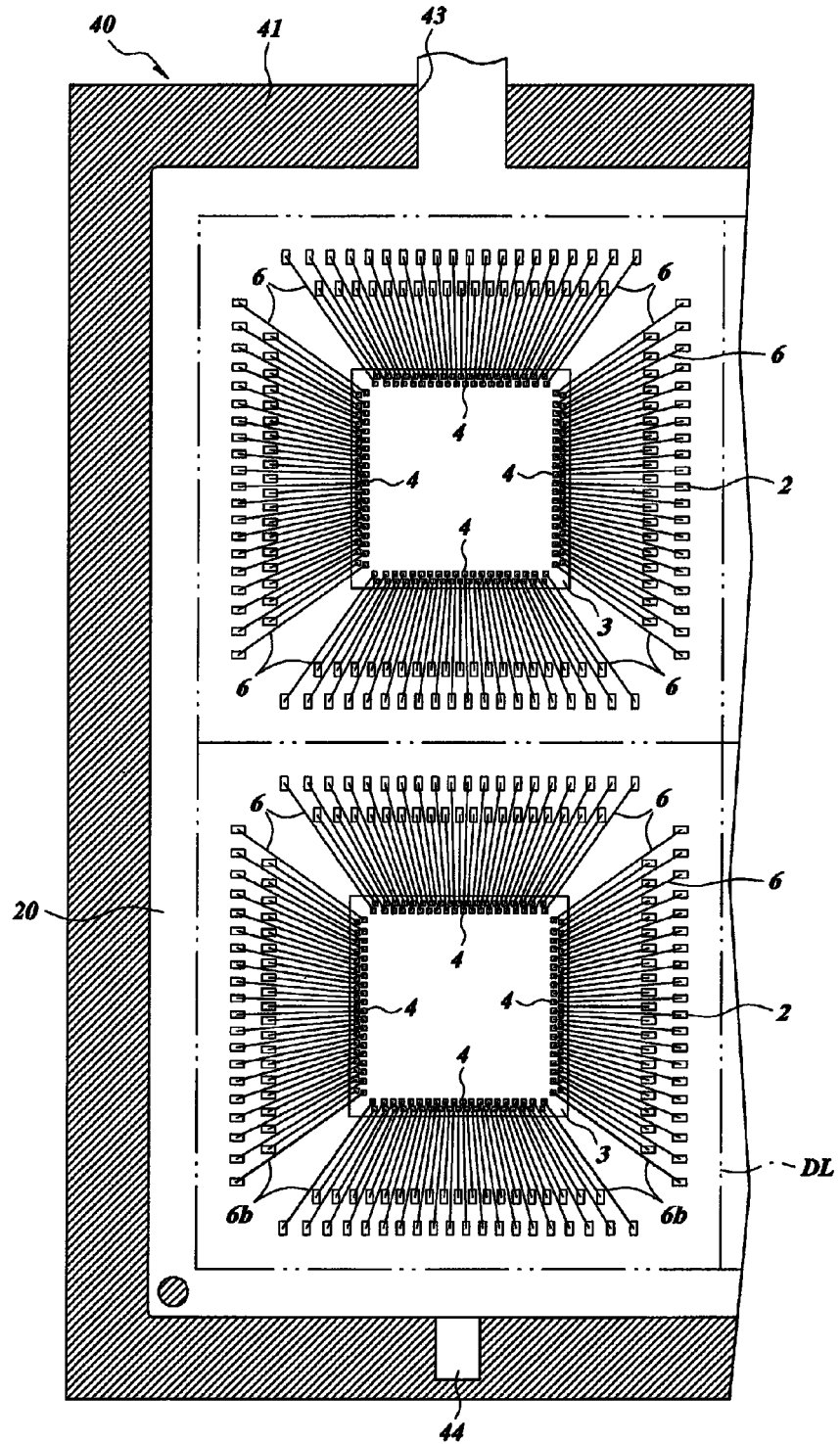
FIG. 36 is a partial plan view of a molding die and a large-sized wiring board showing a semiconductor device, which is a modified example of the present invention.
Figure 37:
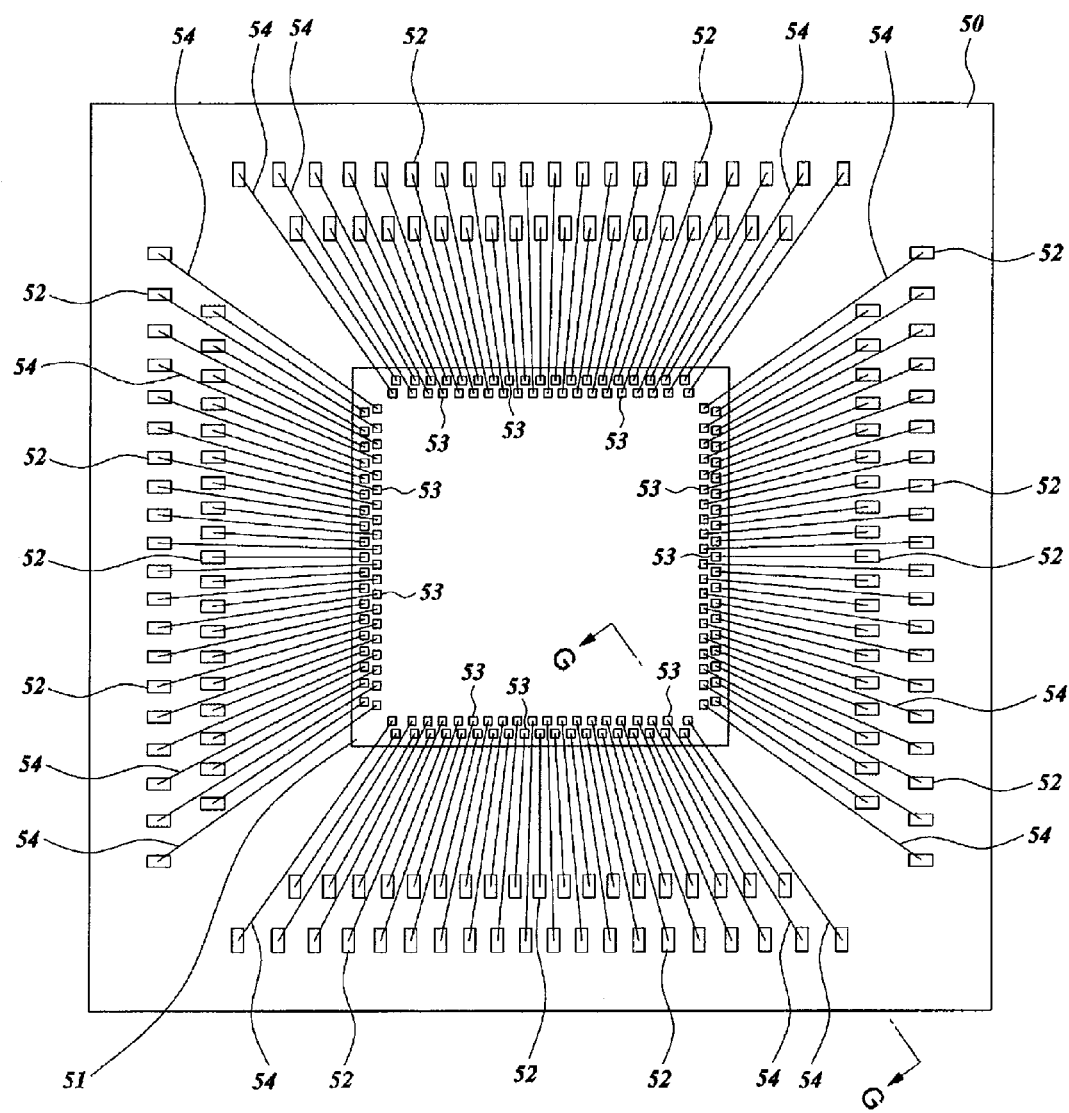
FIG. 37 is a plan view for explaining a problem of the prior art the inventors of the present invention have examined.
Figure 38:
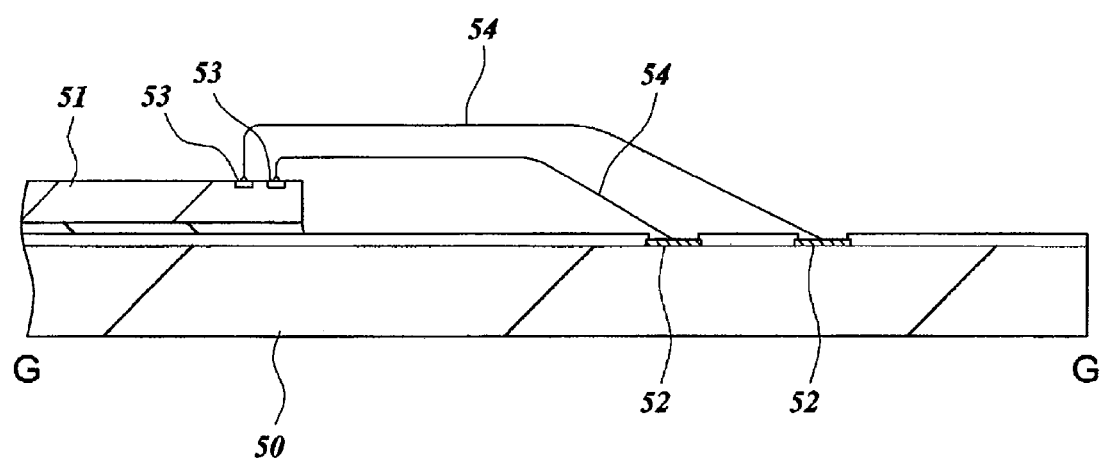
FIG. 38 is a section view along G-G line in FIG. 37.
Figure 39:
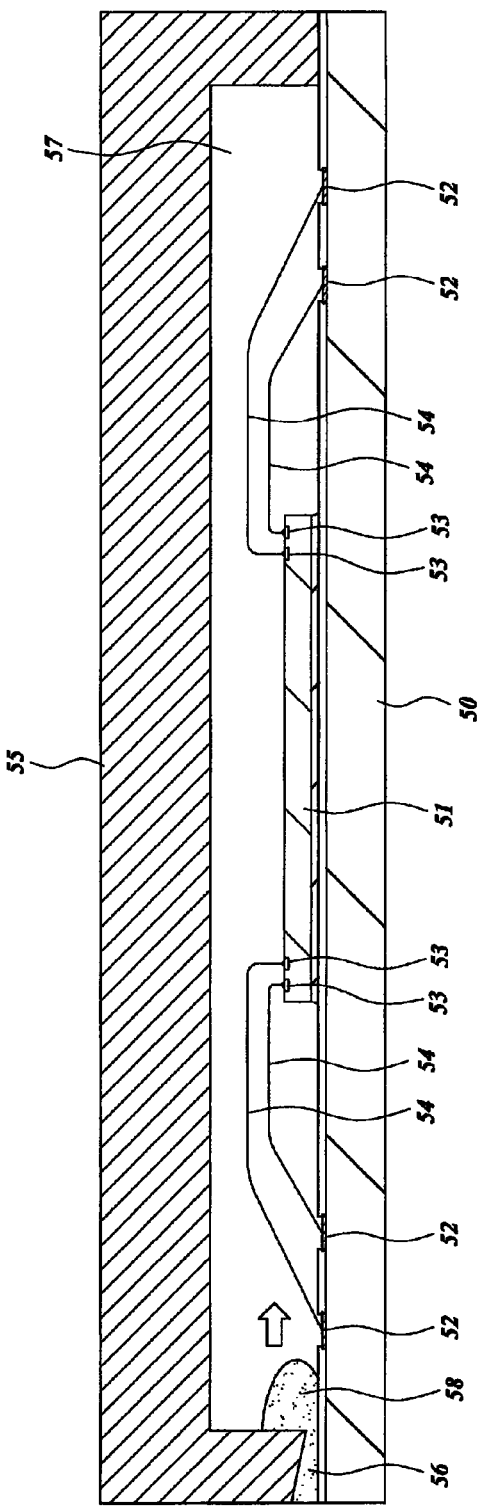
FIG. 39 is a section view for explaining a problem of the prior art the inventors of the present invention have examined.
Figure 40:
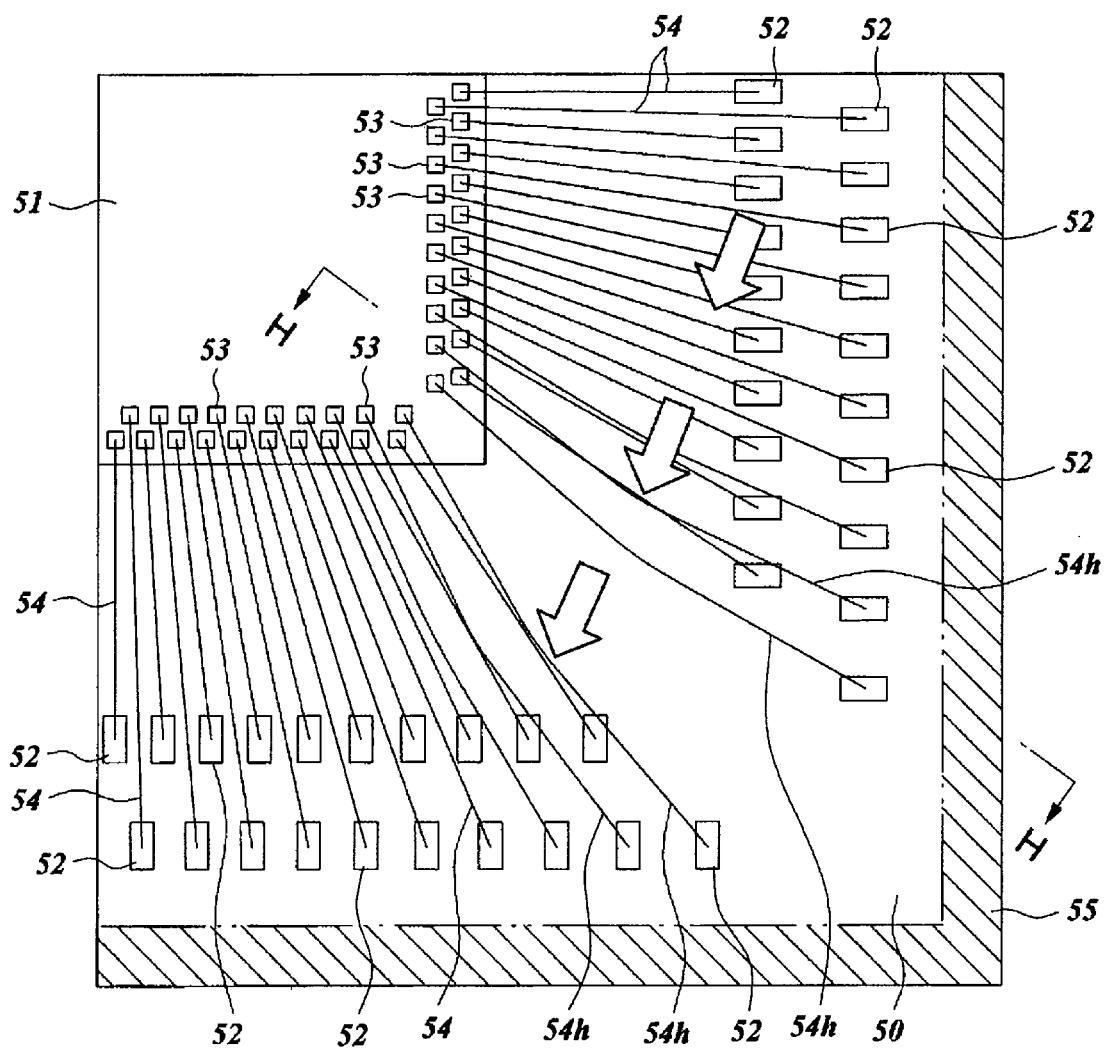
FIG. 40 is a plan view of essential parts for explaining a problem of the prior art the inventors of the present invention have examined.
Figure 41:
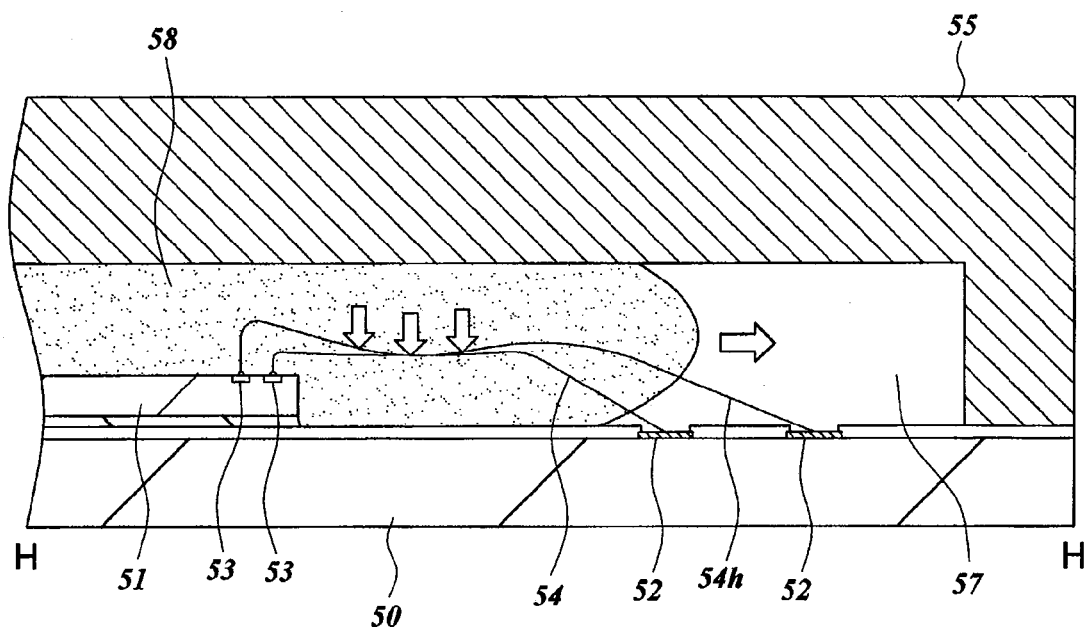
FIG. 41 is a section view along H-H line in FIG. 40.
Figure 42:
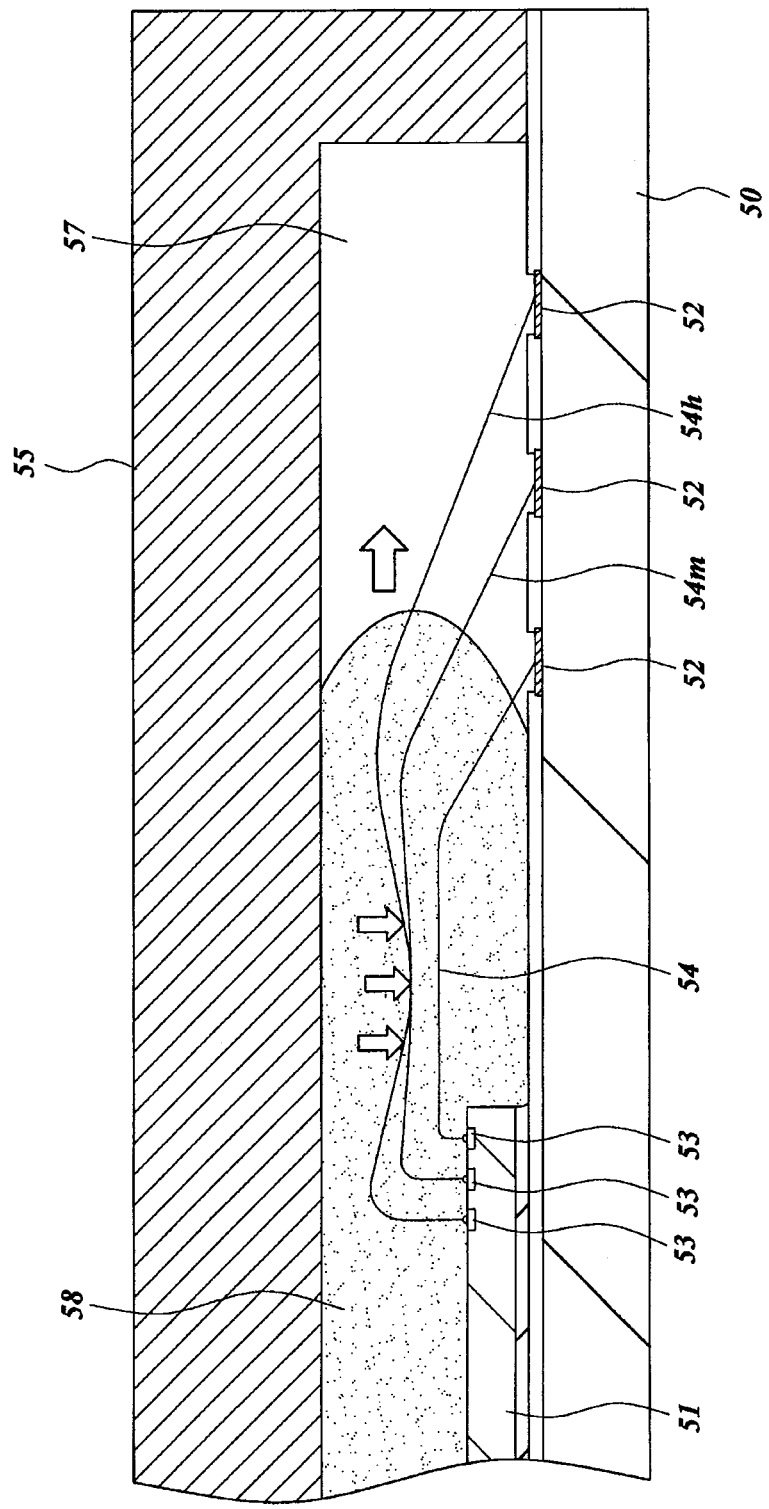
FIG. 42 is a section view of essential parts for explaining a problem of the prior art the inventors of the present invention have examined.

Because of the above, as shown in FIG. 36, in the chip 3 located in the row closer to the air vent 44, only the diameter of the high loop wires (corner part wires) 6b arranged in the vicinity of the two corner parts located on the side closer to the air vent 44 is made larger and in the chip 3 located in the row closer to the gate 43, the diameter of all the wires 6 may be reduced.

The present invention made by the inventors of the present invention is specifically explained based on the embodiments, however, the present invention is not limited to the embodiments and it is needless to say that there can be various modifications in the scope not deviating from its gist.

In the first and second embodiments, the diameter of the wire (corner part wire) 6b arranged in the position closest to the corner part of the chip 3 is made larger than the diameter of the other wires 6, however, this is not limited and the diameter of the high loop wire neighboring the wire (corner part wire) 6b may be made the same as the diameter of the corner part wire 6b. That is, the number of the wires 6b having a large diameter coupled to the second column bonding pad 4 of the chip 3 may be nine or more.

In the first and second embodiments, the semiconductor device that employs the two-stage loop structure is explained, however, it is of course possible to apply the present invention to a semiconductor device that employs a three- or multi-stage loop structure. In this case, the diameter of the wire (wire with the greatest loop height) of the wires arranged in the vicinity of the corner part of the chip, which is located on the uppermost stage side, is made larger than the diameter of the other wires.

In the first and second embodiments, the gold wire is used, however, a copper wire may be used.

In the first and second embodiments, the semiconductor device that mounts the chip on the upper surface of the wiring board is explained. However, it is also possible to apply the present invention to a semiconductor device in which the chip is mounted on the upper surface of the lead frame and the lead of the lead frame and the bonding wire of the chip are electrically coupled with a wire having a multi-stage loop structure.

The present invention can be utilized in a semiconductor device in which a wiring board and a semiconductor chip mounted on the upper surface thereof are electrically coupled with a wire.

What is claimed is:

1. A semiconductor device comprising:
a wiring board including an upper surface, a plurality of bonding leads formed on the upper surface, a lower surface opposite to the upper surface, and a plurality of lands formed on the lower surface, a shape in a plan view of the upper surface being comprised of a quadrangle;
a semiconductor chip including a front surface, a plurality of bonding pads formed on the front surface, and a rear surface opposite to the front surface, and mounted over the upper surface of the wiring board, a shape in the plan view of the front surface being comprised of a quadrangle;
a plurality of wires electrically connecting the bonding pads with the bonding leads, respectively; and
a sealing body sealing the semiconductor chip and the wires,
wherein the bonding leads have a plurality of first row bonding leads arranged along a first substrate side of the upper surface of the wiring board in the plan view, and a plurality of second row bonding leads arranged along the first substrate side of the upper surface of the wiring board and arranged between the first row bonding leads and the first substrate side in the plan view,
wherein the bonding pads have a plurality of first row bonding pads arranged along a first chip side of the front surface of the semiconductor chip in the plan view, and a plurality of second row bonding pads arranged along the first chip side of the front surface of the semiconductor chip and arranged on the side closer to the central part of the front surface than the first row bonding pads in the plan view,
wherein the semiconductor chip is mounted over the upper surface of the wiring board such that the first chip side of the semiconductor chip aligns with the first substrate side of the wiring board,
wherein the wires have a plurality of first wires electrically connecting the first row bonding pads with the first row bonding leads, respectively, and a plurality of second wires electrically connecting the second row bonding pads with the second row bonding leads, respectively, and
wherein each of the second wires has a part farther from the upper surface of the wiring board than the first wires, and
wherein the diameter of a corner part wire of the second wires, which is coupled to a bonding pad arranged at the corner part on the front surface of the semiconductor chip, is larger than the diameter of each of the first wires and the second wires other than the corner part wire.

2. The semiconductor device according to claim 1, wherein the length of the corner part wire is greater than that of the wire of the first wires and the second wires other than the corner part wire.

3. The semiconductor device according to claim 1, wherein the wire is made of gold.

4. The semiconductor device according to claim 1, wherein the first row bonding pads and the second row bonding pads formed on the front surface of the semiconductor chip are arranged in a staggered manner along the first chip side of the semiconductor chip in the plan view.

5. The semiconductor device according to claim 1, wherein a plurality of ball electrodes are electrically connected with the lands formed on the lower surface of the wiring board, respectively.

* * * * *